United States Patent
Miyake et al.

(10) Patent No.: US 9,041,453 B2
(45) Date of Patent: May 26, 2015

(54) PULSE GENERATION CIRCUIT AND SEMICONDUCTOR DEVICE

(71) Applicant: SEMICONDUCTOR ENERGY LABORATORY CO., LTD., Atsugi-shi, Kanagawa-ken (JP)

(72) Inventors: Hiroyuki Miyake, Kanagawa (JP); Kouhei Toyotaka, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 14/221,523

(22) Filed: Mar. 21, 2014

(65) Prior Publication Data
US 2014/0300399 A1 Oct. 9, 2014

(30) Foreign Application Priority Data
Apr. 4, 2013 (JP) .................... 2013-078202

(51) Int. Cl.
*H03K 3/00* (2006.01)
*G06F 1/04* (2006.01)
*H03K 3/356* (2006.01)
*G09G 3/36* (2006.01)

(52) U.S. Cl.
CPC ........ *H03K 3/356026* (2013.01); *G09G 3/3648* (2013.01)

(58) Field of Classification Search
USPC ......... 327/291, 293–297, 241, 242, 427, 434, 327/437, 408, 165, 166, 170–177; 377/64, 377/68, 78, 79, 54; 345/42; 326/46
See application file for complete search history.

(56) References Cited

U.S. PATENT DOCUMENTS

| | | | |
|---|---|---|---|
| 8,243,873 B2 | 8/2012 | Koyama et al. | |
| 8,773,173 B2 | 7/2014 | Watanabe | |
| 2004/0257147 A1* | 12/2004 | Jeoung et al. | 327/427 |
| 2006/0193160 A1 | 8/2006 | Hanzawa et al. | |
| 2008/0258998 A1* | 10/2008 | Miyake | 345/42 |
| 2011/0216876 A1* | 9/2011 | Amano et al. | 377/75 |
| 2011/0221734 A1 | 9/2011 | Umezaki et al. | |
| 2011/0285675 A1* | 11/2011 | Amano et al. | 345/204 |
| 2013/0088468 A1 | 4/2013 | Sakakura et al. | |
| 2013/0135278 A1 | 5/2013 | Toyotaka | |
| 2013/0223584 A1 | 8/2013 | Umezaki | |

(Continued)

FOREIGN PATENT DOCUMENTS

| | | |
|---|---|---|
| JP | 2011-090761 A | 5/2011 |
| JP | 2011-209714 A | 10/2011 |

*Primary Examiner* — Lincoln Donovan
*Assistant Examiner* — Thomas Skibinski
(74) *Attorney, Agent, or Firm* — Nixon Peabody LLP; Jeffrey L. Costellia

(57) ABSTRACT

Two gate drivers each comprising a shift register and a demultiplexer including single conductivity type transistors are provided on left and right sides of a pixel portion. Gate lines are alternately connected to the left-side and right-side gate drivers in every M rows. The shift register includes k first unit circuits connected in cascade. The demultiplexer includes k second unit circuits to each of which a signal is input from the first unit circuit and to each of which M gate lines are connected. The second unit circuit selects one or more wirings which output an input signal from the first unit circuit among M gate lines, and outputs the signal from the first unit circuit to the selected wiring(s). Since gate signals can be output from an output of a one-stage shift register to the M gate lines, the width of the shift register can be narrowed.

13 Claims, 28 Drawing Sheets

(56) References Cited

U.S. PATENT DOCUMENTS

| | | |
|---|---|---|
| 2013/0278324 A1 | 10/2013 | Kaneyasu et al. |
| 2013/0322592 A1* | 12/2013 | Miyake et al. .................. 377/64 |
| 2013/0328612 A1* | 12/2013 | Ofuji et al. .................... 327/408 |
| 2014/0027765 A1 | 1/2014 | Toyotaka |
| 2014/0042443 A1 | 2/2014 | Yamazaki |
| 2014/0070880 A1 | 3/2014 | Umezaki |
| 2014/0118235 A1 | 5/2014 | Hong et al. |
| 2014/0241487 A1 | 8/2014 | Yamazaki et al. |

* cited by examiner prior art

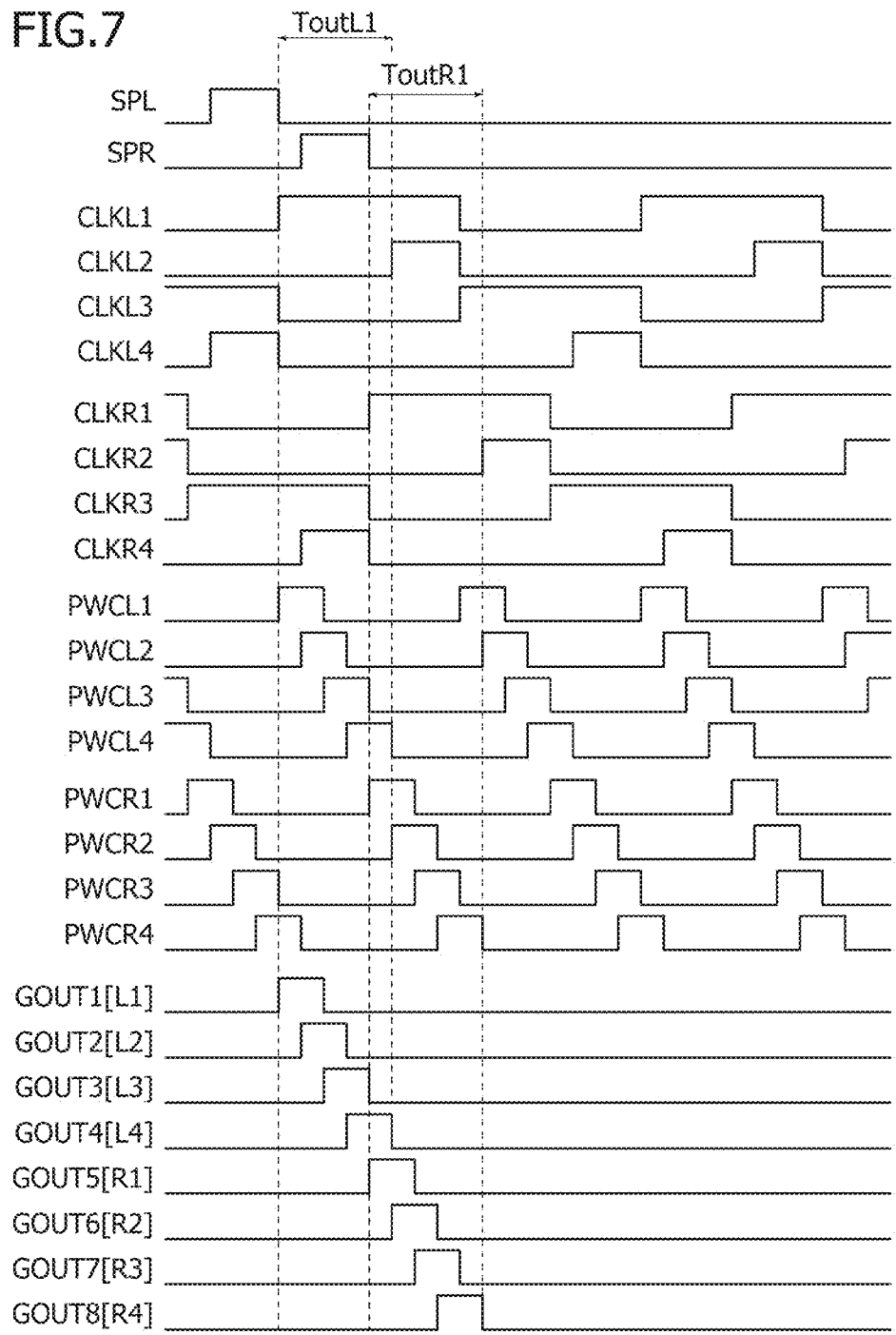

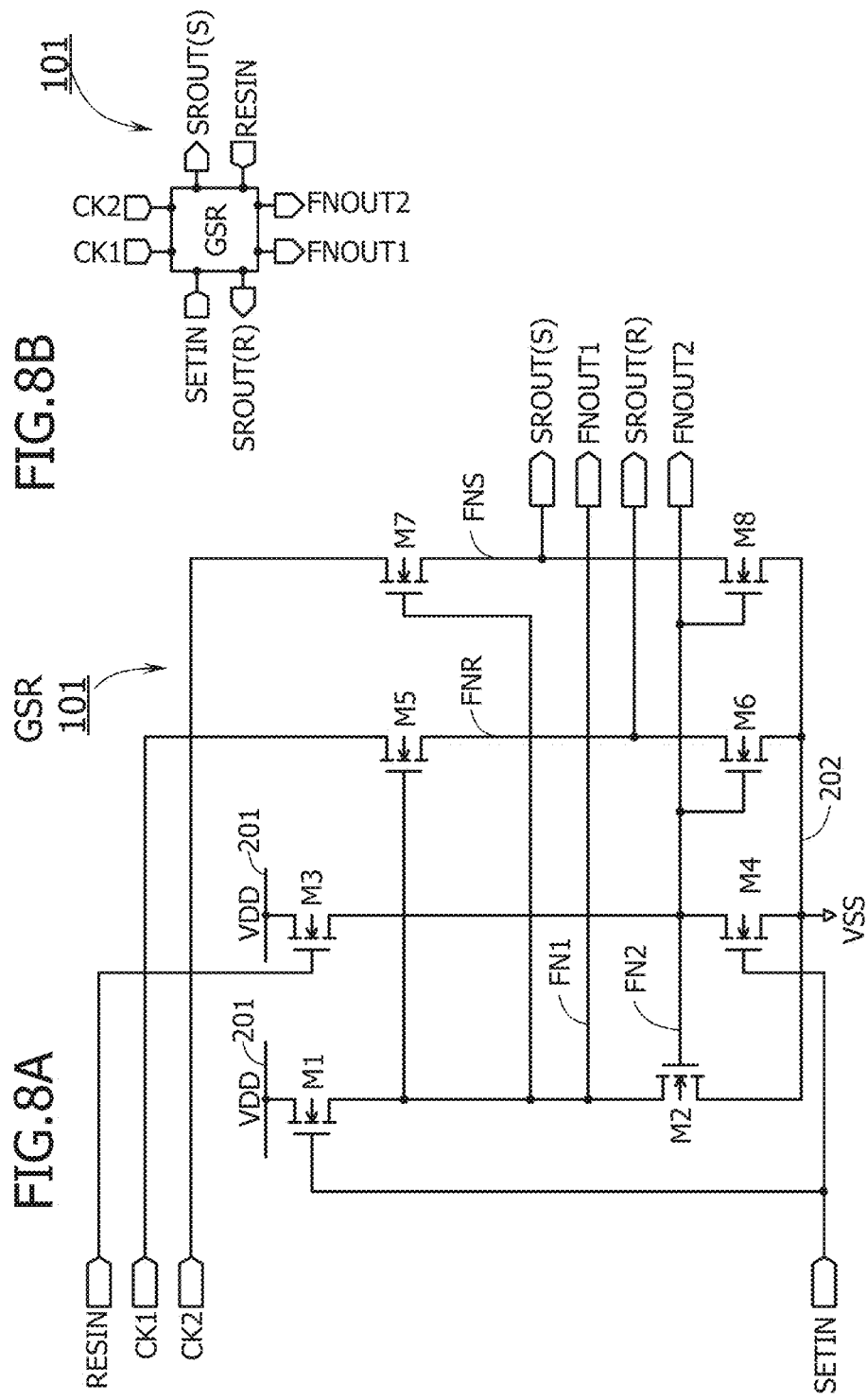

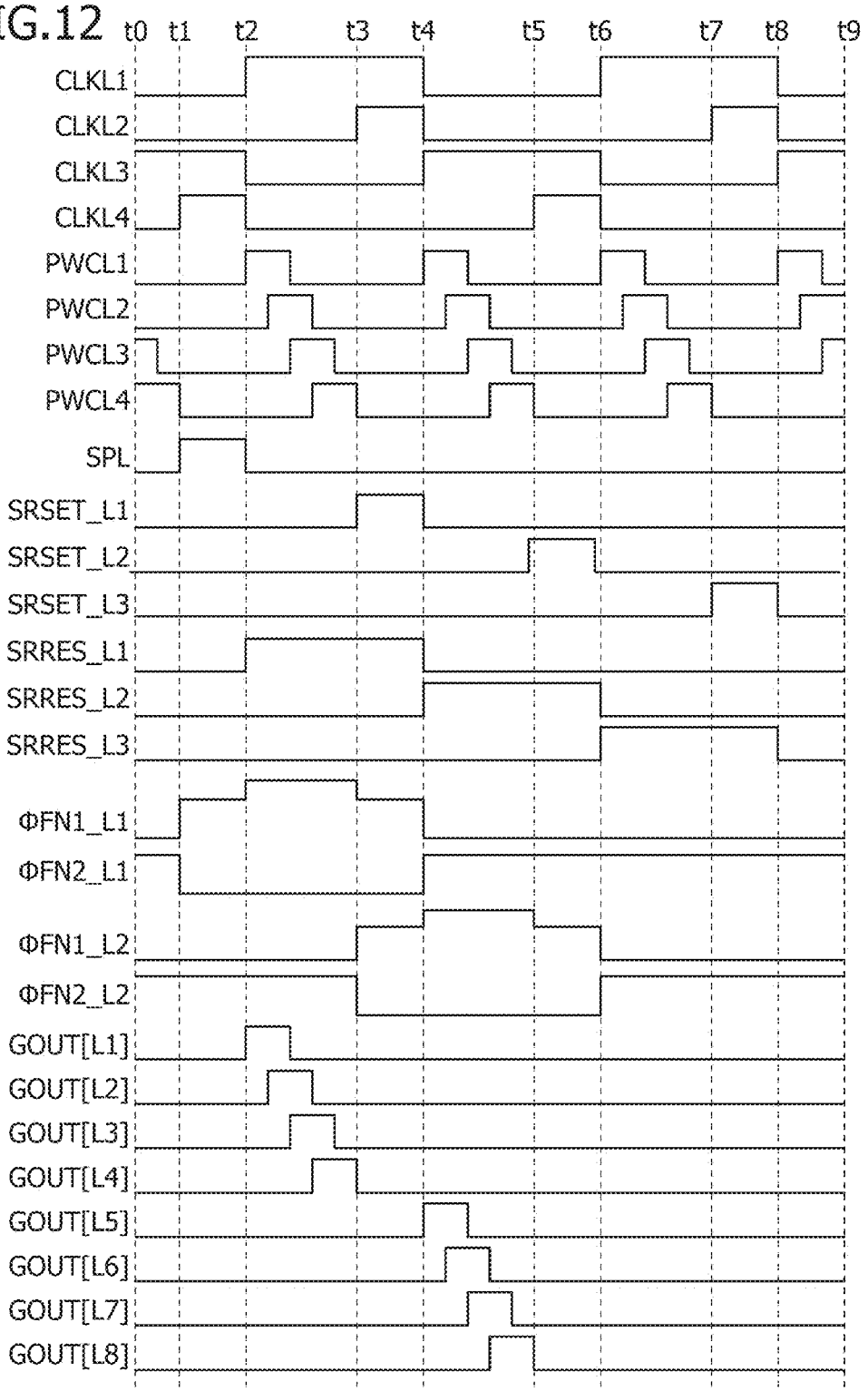

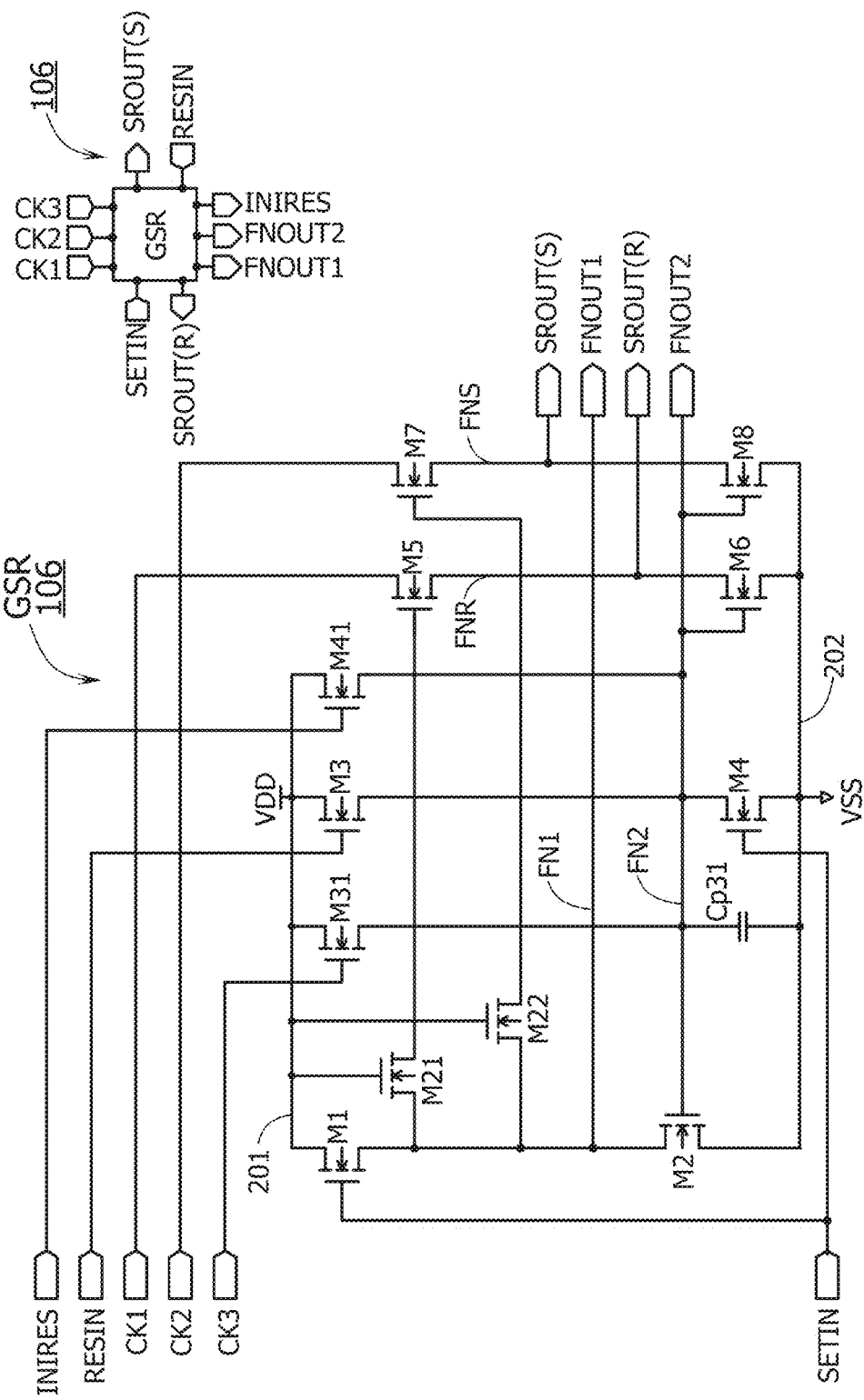

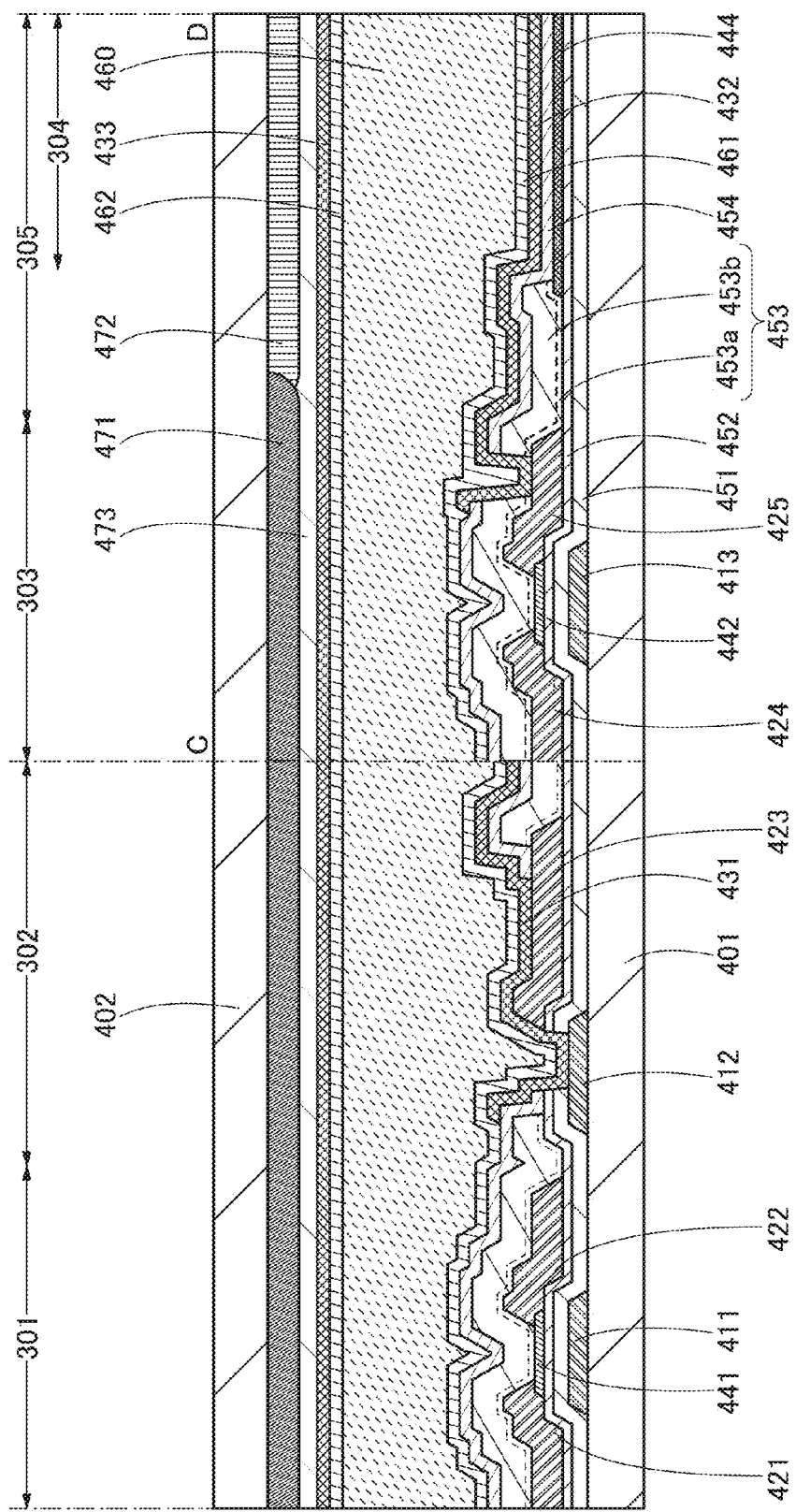

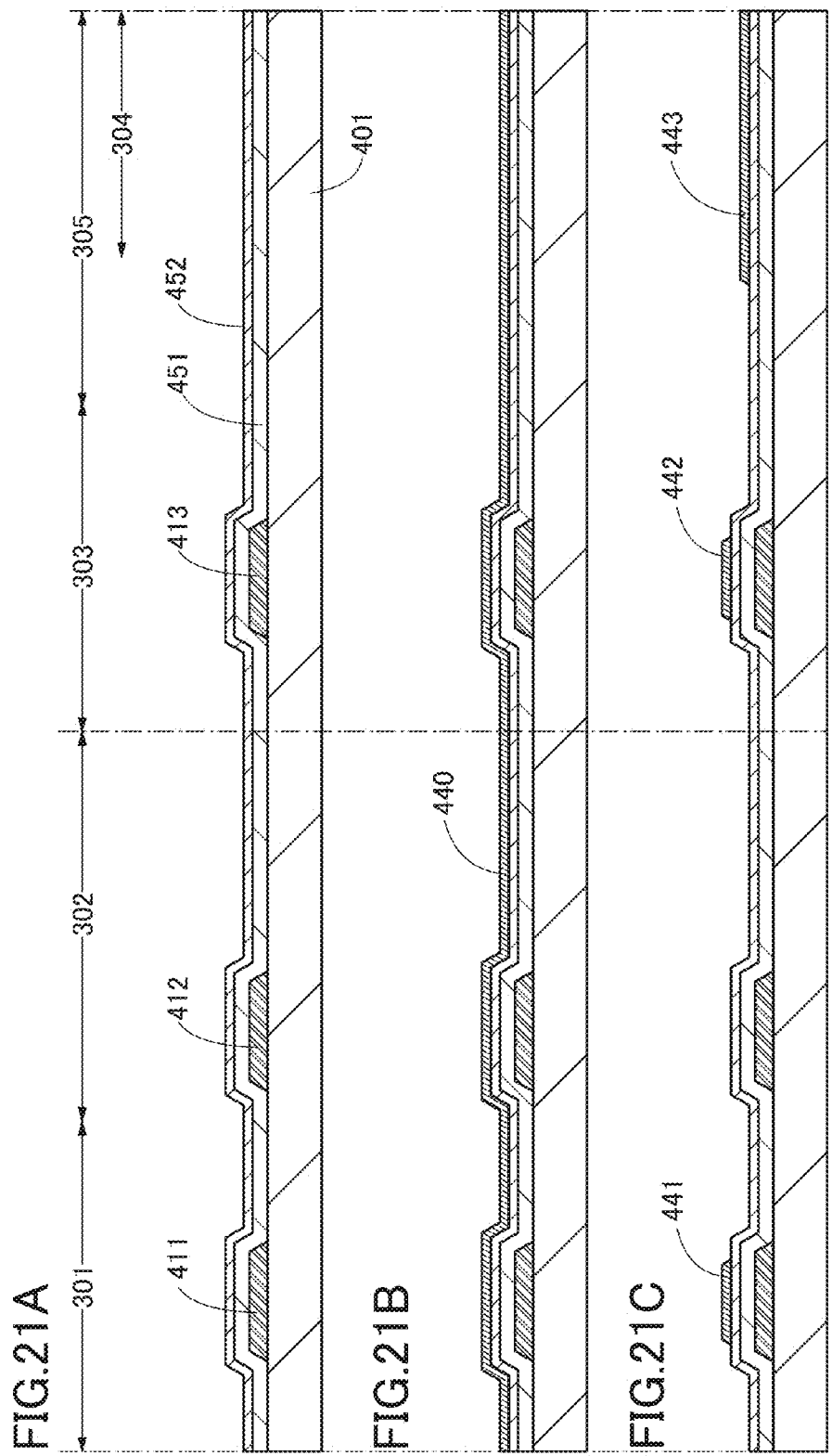

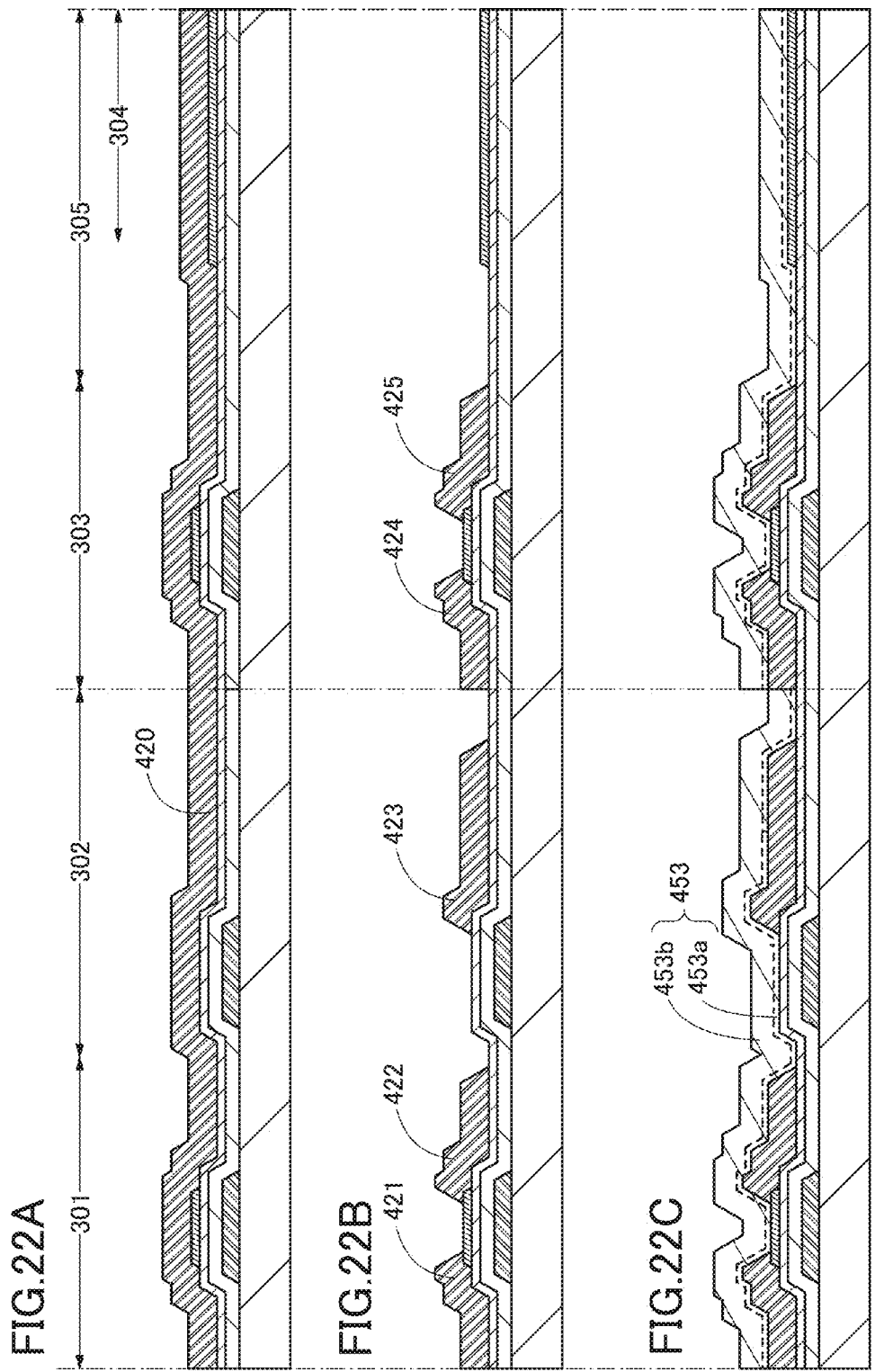

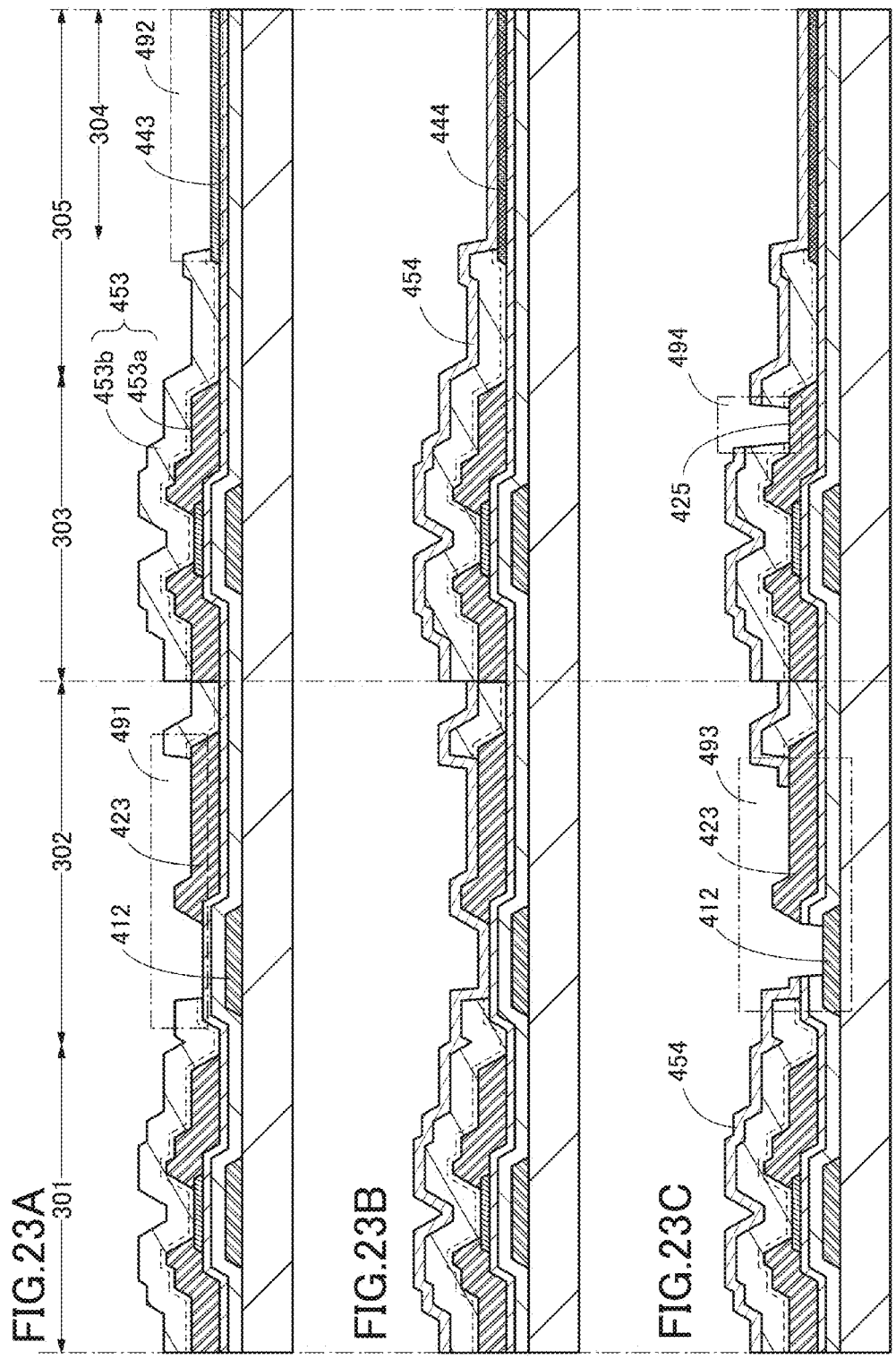

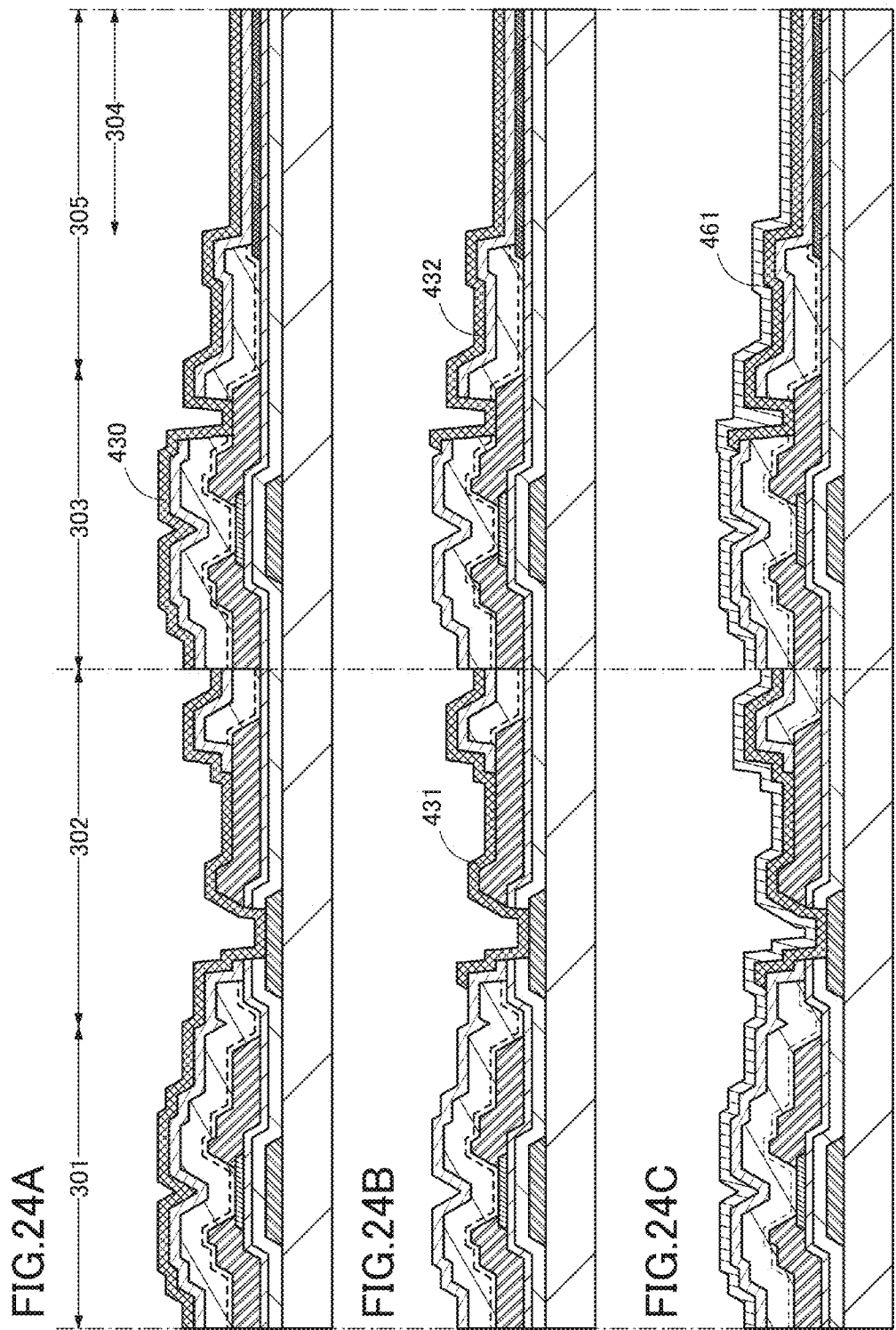

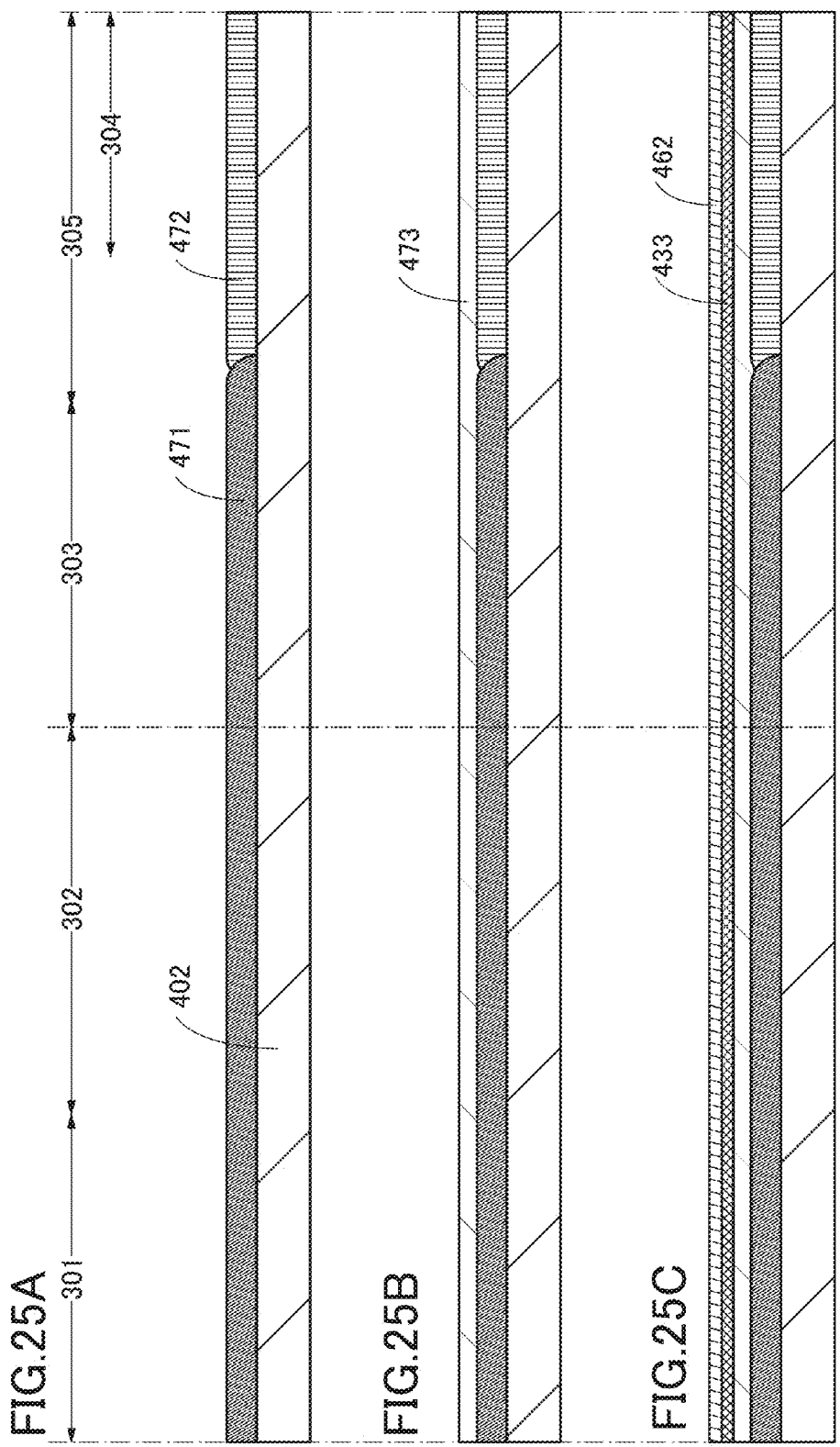

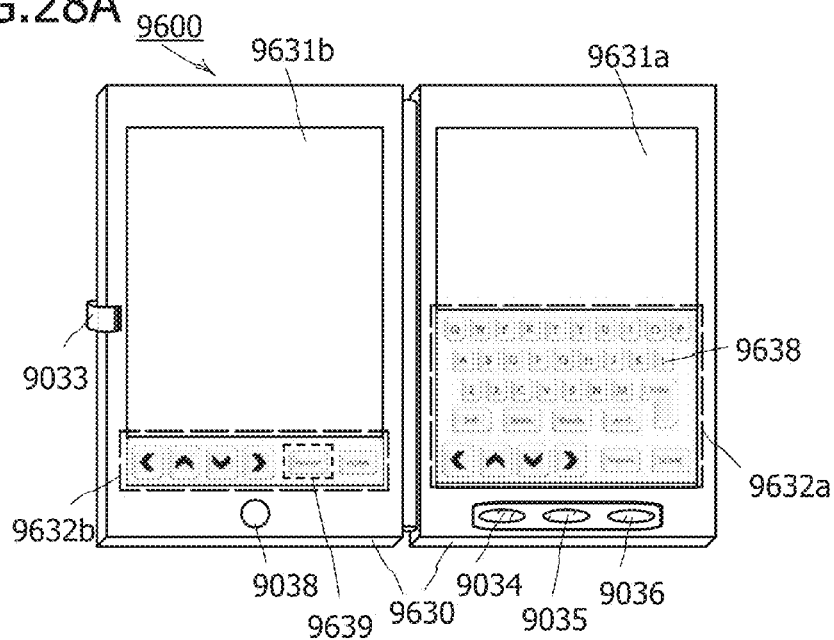
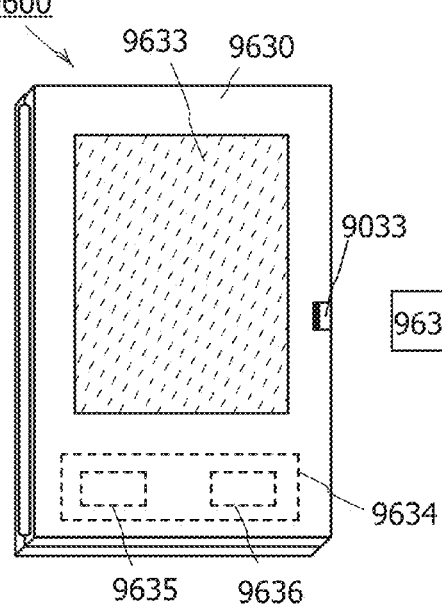
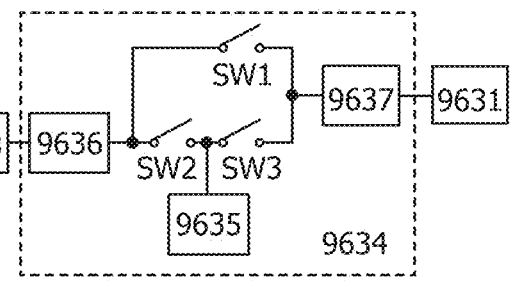

PULSE GENERATION CIRCUIT AND SEMICONDUCTOR DEVICE

BACKGROUND OF THE INVENTION

1. Field of the Invention

The present invention relates to a semiconductor device, a driving method of the semiconductor device, and the like. The present invention particularly relates to a circuit for a display device.

Note that in this specification, a semiconductor device means a circuit including a semiconductor element (e.g., a transistor or a diode) and a device including the circuit. The semiconductor device also means any device that can function by utilizing semiconductor characteristics. For example, an integrated circuit, a chip having an integrated circuit, a display device, a light-emitting device, a lighting device, and an electronic device are all semiconductor devices.

2. Description of the Related Art

A screen of an active matrix display device includes a plurality of pixels arranged in an array. The pixels are each configured with a circuit. The pixel circuits in the same row are connected to a gate line in that row, and the pixel circuits in the same column are connected to a source line in that column. The pixel circuit is provided with a switch which controls an on or off state by a gate signal input to the gate line. Pulse signals are sequentially supplied to the gate lines arranged in a vertical direction from a gate driver, so that pixels are selected row by row. To the pixel circuits of the selected row, a source signal corresponding to an image signal is input from a source line.

Further, as one of means of downsizing, weight saving, and obtaining narrowed frame of an active matrix display device, it has been known to form a gate driver and a pixel portion on one substrate. Pixel circuits of the display device can be formed with either an n-channel transistor or a p-channel transistor. However, it is preferable to design a gate driver with a single conductivity type transistor instead of using a CMOS circuit in order to manufacture a display device having a narrow bezel width with reduced number of manufacturing steps and manufacturing cost.

Main circuits of the gate driver are shift registers. For example, Patent documents 1 and 2 each disclose a shift register including single conductivity type transistors. Patent document 1 discloses a gate driver in which a demultiplexer is connected to an output terminal of a shift register. Patent document 2 discloses a gate driver capable of partial driving by which data displayed on the screen is partly rewritten.

REFERENCE

Patent Document

[Patent Document 1] Japanese Published Patent Application No. 2011-090761
[Patent Document 2] Japanese Published Patent Application No. 2011-209714

SUMMARY OF THE INVENTION

In view of the above, one object of one embodiment of the present invention is to provide a novel circuit which has a function of generating pulse signals output to a plurality of wirings from an output signal of a one-stage shift register and includes single conductivity type transistors. Another object of one embodiment of the present invention is to provide a display device having a narrow frame width by designing the layout of gate drivers. Moreover, another object of one embodiment of the present invention is to provide a novel gate driver capable of partial driving of a display device.

Note that the description of a plurality of objects does not mutually preclude the existence. Note that one embodiment of the present invention does not necessarily achieve all the objects listed above. Objects other than those listed above are apparent from the description of the specification, drawings, and claims, and also such objects could be an object of one embodiment of the present invention.

One embodiment of the present invention is a pulse generation circuit, which has a function of sequentially outputting pulse signals to a plurality of wirings and includes a single conductivity type transistor. The pulse generation circuit includes k (k is an integer of 2 or more)-stage first unit circuits connected in cascade and k second unit circuits in each of which an input is connected to one of the first unit circuits and an output is connected to M (M is an integer of 2 or more) wirings. In the first unit circuit, a first signal is generated and output to the first unit circuit in a next stage, a second signal is generated and output to the first unit circuit in a previous stage, output of a third signal to the second unit circuit is started in accordance with the first signal input from the first unit circuit in the previous stage, the output of the third signal to the second unit circuit is stopped in accordance with the second signal input from the first unit circuit in the next stage, and the second unit circuit generates M pulse signals from the third signal and output the M pulse signals to the M wirings.

In the pulse generation circuit of the above embodiment, the first unit circuit may generate a fourth signal and output the fourth signal to the second unit circuit, and the second unit circuit may input a constant voltage to the M wirings in accordance with the fourth signal.

In the pulse generation circuit of the above embodiment, the second unit circuit may generate the M pulse signals having pulsed widths corresponding to pulse widths of M control signals.

By applying the pulse generation circuit of the above embodiment to a gate driver for generating a gate signal, a display device can be provided.

According to one embodiment of the present invention, it is possible to provide a novel circuit which has a function of generating pulse signals output from an output signal of a one-stage shift register to a plurality of wirings and includes single conductivity type transistors. According to one embodiment of the present invention, it is possible to provide a display device having a narrowed frame width by designing the layout of gate drivers.

BRIEF DESCRIPTION OF THE DRAWINGS

FIG. 7 is a timing chart illustrating an example of a driving method of a gate driver.

FIG. 8A is a circuit diagram illustrating a structural example of a unit circuit (GSR), and FIG. 8B is a block diagram thereof.

FIG. 12 is a timing chart illustrating an example of a driving method of a unit circuit (GSR).

FIG. 16A is a circuit diagram illustrating a structural example of a unit circuit (GSR), and FIG. 16B is a block diagram thereof.

FIG. 20 is a cross-sectional view illustrating a structural example of an LC panel (a pixel circuit and a driver).

FIGS. 21A to 21C are cross-sectional views illustrating an example of a method for manufacturing an element substrate of an LC panel.

FIGS. 22A to 22C are cross-sectional views illustrating an example of steps following the step in FIG. 21C.

FIGS. 23A to 23C are cross-sectional views illustrating an example of steps following the step in FIG. 22C.

FIGS. 24A to 24C are cross-sectional views illustrating an example of steps following the step in FIG. 23C.

FIGS. 25A to 25C are cross-sectional views illustrating an example of a method for manufacturing a counter substrate of an LC panel.

FIGS. 28A to 28C illustrate an example of an electronic device.

DETAILED DESCRIPTION OF THE INVENTION

Figure 1:
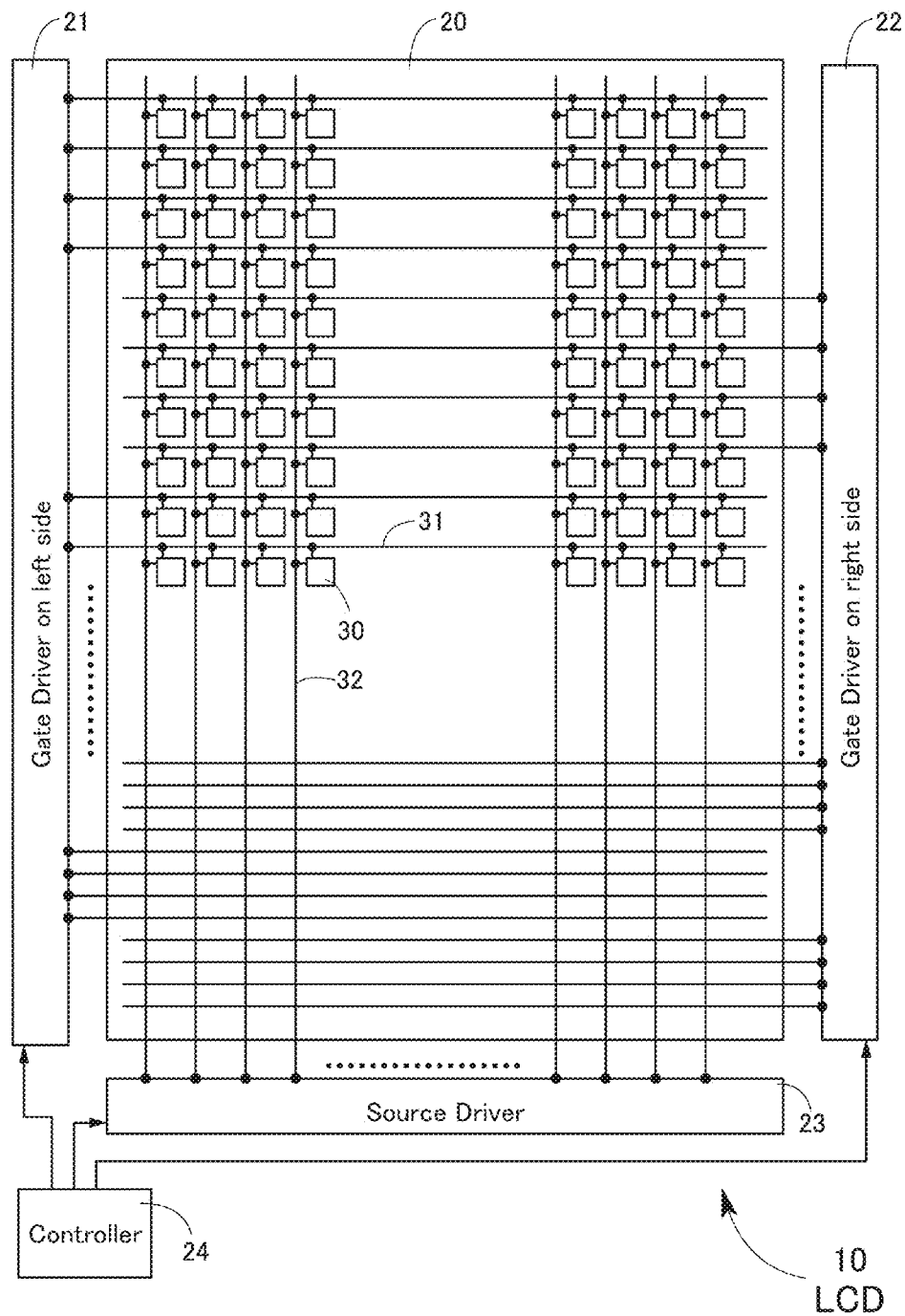
FIG. 1 is a block diagram illustrating a structural example of a liquid crystal display device.

Embodiments of the present invention will be described below in detail with reference to the drawings. Note that the present invention is not limited to the description below, and it is easily understood by those skilled in the art that a variety of changes and modifications can be made without departing from the spirit and scope of the present invention. Therefore, the present invention should not be construed as being limited to the description of the embodiments below.

In the drawings used for the description of embodiments of the present invention, the same portions or portions having a similar function are denoted by the same reference numerals, and the repeated description thereof is omitted.

Embodiment 1

In this embodiment, as an example of a semiconductor device, a liquid crystal display device (hereinafter referred to as LCD) will be described.

<Structural Example of LCD>

Figure 2A:
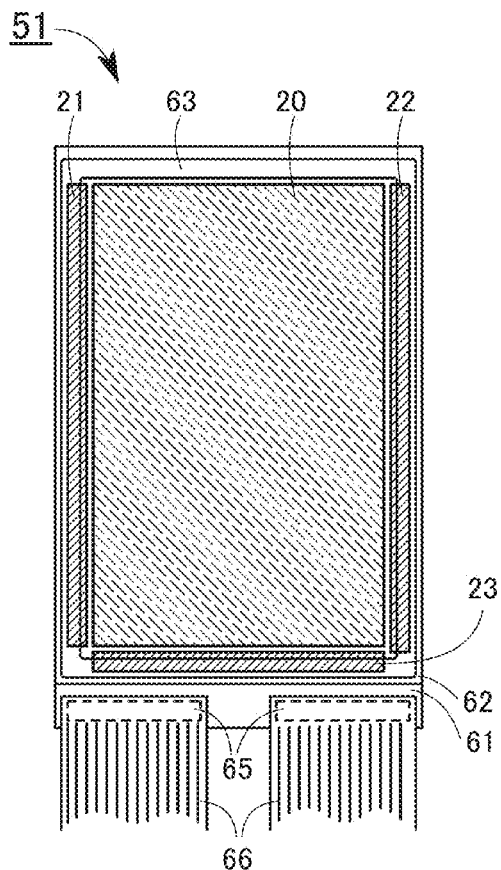
FIGS. 2A and 2B are plan views each illustrating a structural example of a liquid crystal panel.
Figure 2B:
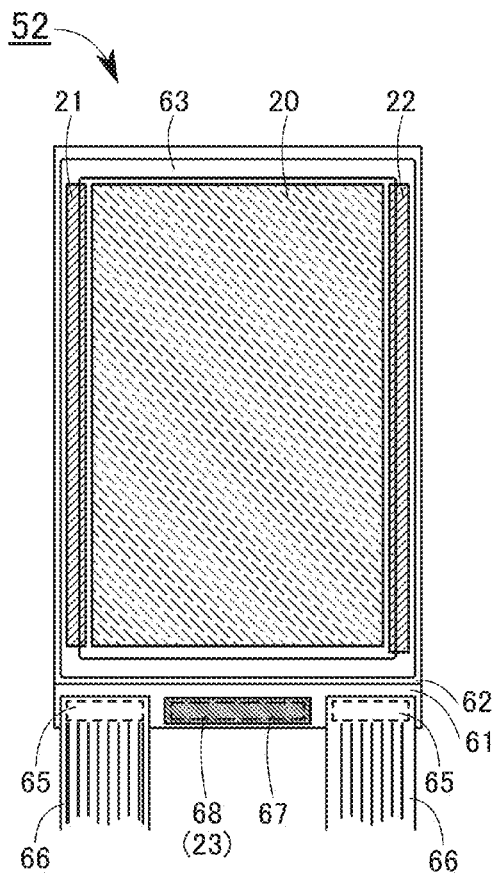

The LCD is a semiconductor device including a liquid crystal panel (LC panel), a controller, a power supply circuit, a backlight module, and the like. FIG. 1 is a block diagram illustrating a structural example of an active matrix LCD. FIGS. 2A and 2B each illustrate a structural example of a liquid crystal panel (LC panel) for forming the LCD.

As shown in FIG. 1, an LCD 10 includes a pixel portion 20, a gate driver 21, a gate driver 22, a source driver 23, and a controller 24. FIG. 2A illustrates a structural example of an LC panel in which the pixel portion 20 and all of the drivers 21, 22, and 23 are formed over one substrate, and FIG. 2B illustrates a structural example of an LC panel in which the pixel portion 20 and the gate drivers 21 and 22 are formed over one substrate.

[LC Panel]

The LC panel is also referred to as a liquid crystal (LC) module. The LC panel, a control circuit thereof, a power supply circuit, a backlight module, and the like are incorporated in a housing, so that a liquid crystal display device is completed.

FIG. 2A is a structural example of an LC panel in the case where the pixel portion 20 and the drivers 21, 22, and 23 are circuits including the same conductivity type transistors. An LC panel 51 includes two substrates 61 and 62. The pixel portion 20, the drivers 21, 22, and 23, and terminal portions 65 are formed over the substrate 61.

A plurality of terminals for connecting the pixel portion 20 and the drivers 21, 22, and 23 to external circuits are formed on the terminal portion 65. The terminal portion 65 is connected to flexible printed circuits (FPCs) 66. Here, a structure in which the FPC 66 is not connected to the terminal portion 65 is also included in the LC panel.

The substrate 61 and the substrate 62 face each other with a space (cell gap) for providing a liquid crystal layer held therebetween by a spacer. Either the substrate 61 or the substrate 62 is provided with the spacer. Alternatively, the spacer is sealed between the substrate 61 and the substrate 62.

A sealing member 63 is provided in the periphery of a region where the substrate 61 and the substrate 62 face each other. With the sealing member 63, a liquid crystal layer is sealed between the substrate 61 and the substrate 62. The frame width of the LC panel 51, which does not contribute to display, can be narrowed by providing the sealing member 63 so that the drivers 21, 22, and 23 overlap therewith.

In the LC panel 51, the pixel portion 20 and the drivers 21, 22, and 23 include the same conductivity type transistors. Note that in the case where the source driver 23 includes both an n-channel transistor and a p-channel transistor, an IC chip, which incorporates the source driver 23, may be mounted on the substrate 61 instead of forming the source driver 23 over the substrate 61, together with the pixel portion 20 and the gate drivers 21 and 22.

An LC panel having such a structural example is shown in FIG. 2B. As shown in FIG. 2B, in an LC panel 52, an IC chip including the source driver 23 is mounted on a tape carrier package (TCP) 68. Note that an FPC connected to the IC chip is not illustrated in the TCP 68. A terminal portion 67 connected to the TCP 68 is formed over the substrate 61. A plurality of terminals for connecting source lines of the pixel portion 20 to the TCP 68 are formed in the terminal portion 67. Note that a structure without the TCP 68 is also regarded as one of structural examples of the liquid crystal panel of this embodiment.

Moreover, in the case where some circuits of the source driver 23 are formed with transistors of the same conductivity type as the transistors of the pixel portion 20 and the gate drivers 21 and 22, such circuits may be formed over the substrate 61 and other circuits may be incorporated in an IC chip.

Note that a mounting method of the IC chip is not particularly limited. A method for directly mounting a bare chip on the substrate 61 (a chip on glass (COG)) may be employed. Alternatively, instead of TCP, a system on film (SOF), which incorporates an IC chip, may be attached to the substrate 61.

[Pixel Portion and Pixel Circuit]

As shown in FIG. 1, the pixel portion 20 includes a plurality of pixel circuits 30 arranged in an array, a plurality of gate lines 31 arranged in a vertical direction, and a plurality of source lines 32 arranged in a horizontal direction. The pixel circuits 30 in the same row are connected to the gate line 31 in that row, and the pixel circuits 30 in the same column are connected to the source line 32 in that column.

Figure 2C:
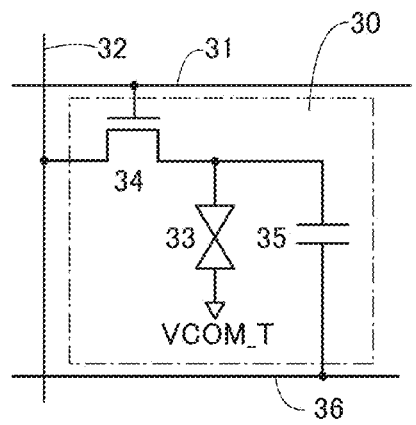
FIGS. 2C and 2D are circuit diagrams each illustrating a structural example of a pixel circuit.

FIG. 2C is a circuit diagram illustrating a structural example of the pixel circuit 30. The pixel circuit 30 includes a liquid crystal element 33, a transistor 34, and a capacitor 35.

The liquid crystal element 33 includes two electrodes and a liquid crystal layer between the two electrodes. One electrode is connected to the transistor 34, and voltage VCOM_T is input to the other electrode. The transistor 34 functions as a switch that connects the liquid crystal element 33 to the source line 32. The capacitor 35 functions as a storage capacitor that holds voltage between the two electrodes of the liquid crystal element 33.

When the transistor 34 is turned on, the liquid crystal element 33 and the capacitor 35 are charged or discharged depending on the potential of the source line 32. Depending on the voltage held in the liquid crystal element 33 and the capacitor 35, the orientation state of the liquid crystal layer changes, resulting in a change in transmittance of the liquid crystal element 33.

Note that a display device other than an LCD can be obtained by changing the circuit structure of the pixel circuit 30. For example, in obtaining electronic paper, the liquid crystal element 33 of FIG. 2C may be substituted with a display element that performs display by an electronic liquid powder method or the like.

Figure 2D:
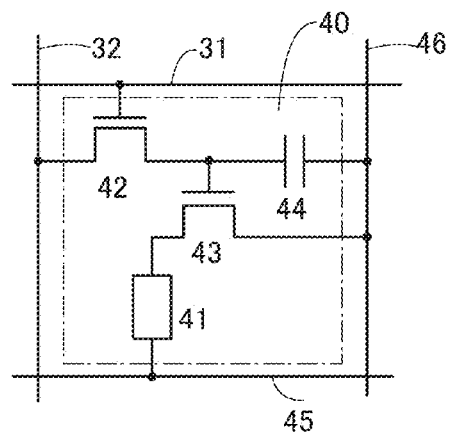

In obtaining an electroluminescence (EL) display device, a pixel circuit 40 of FIG. 2D may be provided in the pixel portion 20. The pixel circuit 40 includes an EL element 41, a transistor 42, a transistor 43, and a capacitor 44.

The EL element 41 includes two electrodes (an anode and a cathode) and a light-emitting layer between the two electrodes. One electrode is connected to a wiring 45 to which a constant voltage is input. The light-emitting layer includes at least a light-emitting substance. Examples of the light-emitting substance include an organic EL material, an inorganic EL material, and the like. Light emission from the light-emitting layer includes light emission (fluorescence) which is generated in returning from a singlet excited state to a ground state and light emission (phosphorescence) which is generated in returning from a triplet excited state to a ground state.

The EL element 41 is capable of changing emission intensity with current flowing between the two electrodes. Here, the emission intensity of the EL element 41 is adjusted by current flowing through the transistor 43. That is, the emission intensity of the EL element 41 is adjusted by a gate voltage of the transistor 43.

The capacitor 44 connects a gate of the transistor 43 and a wiring 46 supplied with a constant voltage. The capacitor 44 functions as a storage capacitor that holds the gate voltage of the transistor 43. The transistor 42 functions as a switch that connects the gate of the transistor 43 and the source line 32. When the transistor 42 is turned on, the capacitor 44 connected to the gate of the transistor 43 is charged or discharged depending on the current flowing through the transistor 42.

[Controller]

The controller 24 is used to control the LCD 10. An image signal, a synchronization signal for controlling rewriting of the screen, and the like are input to the controller 24. Examples of the synchronization signal include a horizontal synchronization signal, a vertical synchronization signal, a reference clock signal, and the like.

[Source Driver]

The source lines 32 are connected to the source driver 23. The source driver 23 has a function of generating a data signal from an image signal input thereto from the controller 24 and outputting the data signal to the source line 32.

[Gate Driver]

Transistors of the gate drivers 21 and 22 are single conductivity type transistors.

The gate drivers 21 and 22 each have a function of outputting a gate signal to the gate line 31 in accordance with a control signal input thereto from the controller 24. The gate signal is a signal for selecting the pixel circuits 30 to which a data signal is to be input. The gate line 31 is connected to either the gate driver 21 or the gate driver 22.

In the conventional case where gate drivers are provided on the left and right sides of a pixel portion as in the LCD 10, gate lines in odd-numbered rows are connected to one of the gate drivers and gate lines in even-numbered rows are connected to the other gate driver. That is, a gate driver to which a gate line is connected alternates in every row.

On the other hand, in the LCD 10, the gate lines 31 are alternately connected to the gate driver 21 and the gate driver 22 in every M rows (M is an integer of 2 or more). In the example of FIG. 1, M is 4.

As shown in FIG. 1, the gate lines 31 are alternately connected to the gate driver 21 and the gate driver 22 in every 4 rows. In other words, in the pixel portion 20, the gate lines 31 are grouped in every M rows, and gate line groups are alternately connected to the gate driver 21 and the gate driver 22.

The structures of the gate drivers 21 and 22 are more specifically described below with reference to FIG. 3.

<Structural Example of Gate Driver>

Figure 3:
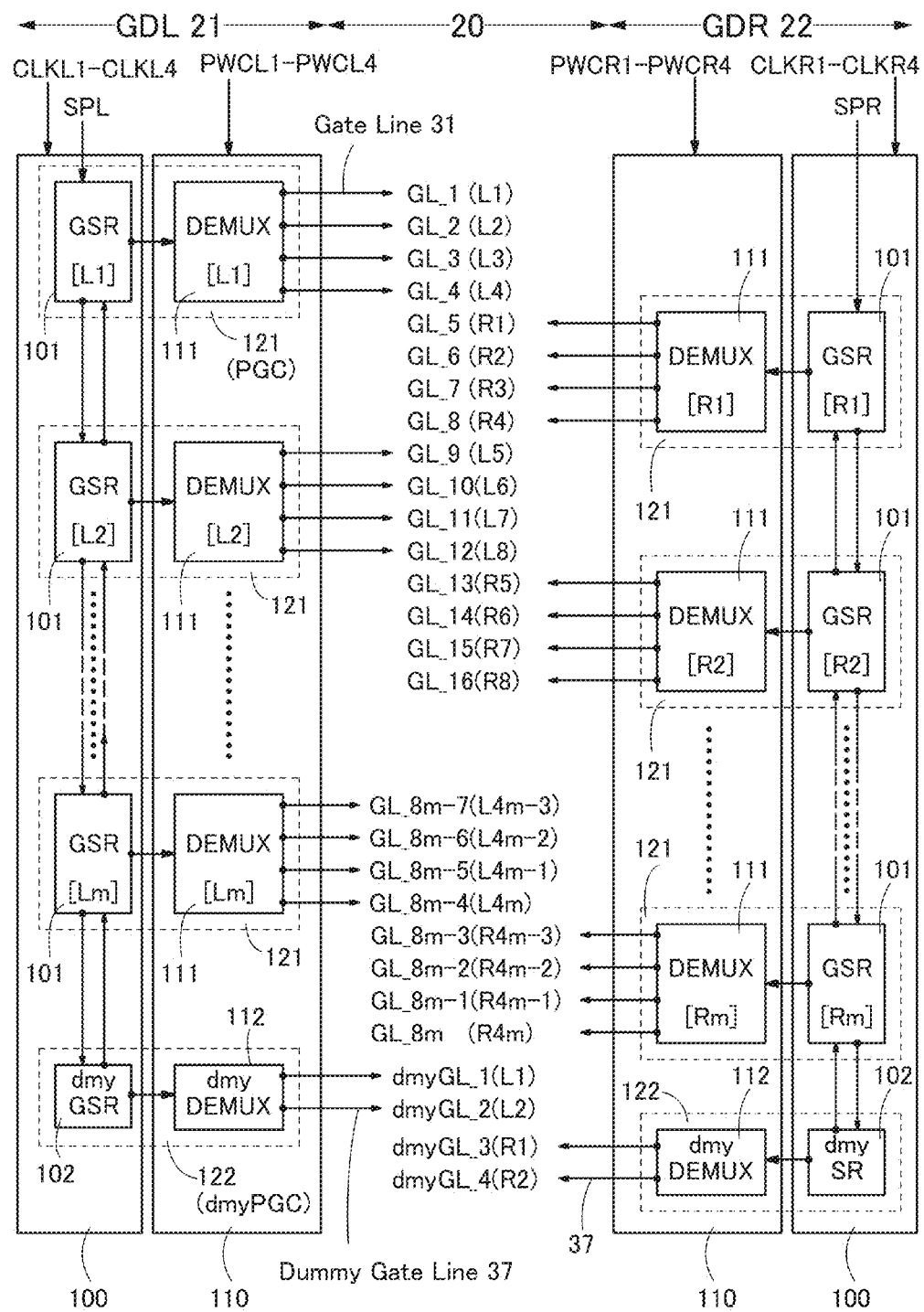
FIG. 3 is a block diagram illustrating a structural example of a gate driver.

FIG. 3 is a block diagram illustrating a structural example of the gate drivers 21 and 22.

Note that in the description below, the circuit and wiring arrangement in FIG. 1 is used as references of terms showing positions (right, left, top, and bottom) and the row and column numbers. For example, the gate driver 21 is to be referred to as the left-side gate driver and the gate driver 22 is to be referred to as the right-side gate driver. In order to make clear the arrangement of the gate drivers 21 and 22, the gate driver 21 is to be referred to as a "GDL 21" and the gate driver 22 is to be referred to as a "GDR 22".

In order to distinguish whether signals and wirings are related to the GDL 21 or the GDR 22, "R" and "L" are added to the terms and reference numerals.

Moreover, in the same element (signal or circuit), identification numbers such as "_1" and "[L1]" are added to the terms to show row and column numbers, the order, and the like. For example, identification numbers of GL_9 and GL_R5 are added to the same gate lines 31, and, in the entire pixel portion 20, GL_9 denotes the gate line 31 in the ninth row and GL_R5 denotes the gate line 31 in the fifth row connected to the GDR 22.

As shown in FIG. 3, the GDL 21 and the GDR 22 each have the same structure. The GDL 21 and the GDR 22 each include a shift register 100 and a demultiplexer 110. The shift register 100 includes m-stage (m is an integer of 2 or more) unit circuits (GSR) 101 connected in cascade. The demultiplexer 110 includes m unit circuits (DEMUX) 111.

[Shift Register]

The unit circuits 101 are each a one-stage shift register. The unit circuit 101 has a function of transferring an input start pulse signal (SP) to the unit circuit 101 in the next stage in accordance with a control signal (CLK).

The unit circuit 101 is hereinafter abbreviated to GSR 101. Similarly, terms of other circuits, other signals, and the like are sometimes abbreviated as terms in drawings.

The GSR 101 has a function of generating at least a first pulse signal, a second pulse signal, and a third pulse signal. The first pulse signal is a signal corresponding to a start pulse signal to be transferred, and is also a control signal (set signal) serving as a trigger of a set operation. The first pulse signal is output to the GSR 101 in the next stage. The second pulse signal is a control signal (reset signal) serving as a trigger of a reset operation and output to the GSR 101 in the previous stage. The third pulse signal is a pulse signal for generating a gate signal and is output to the DEMUX 111.

Note that to the GSR 101 in the last stage (in the m-th stage), a dummy unit circuit (dmyGSR) 102 is connected. The dmyGSR 102 is a circuit for outputting a second pulse signal (reset signal) to the GSR 101 in the last stage, and a first pulse signal (set signal) is input thereto from the GSR 101 in the last stage.

[Demultiplexer]

The shift register 100 is connected to an input of the demultiplexer 110, and a third pulse signal is input from the shift register 100. A plurality of gate lines 31 (here, 4m gate lines 31) are connected to outputs of the demultiplexer 110. The demultiplexer 110 has a function of selecting one or more gate lines which output a signal among 4m gate lines 31 and outputting a signal input from the shift register 100 to the selected gate line(s) 31. An output signal of the demultiplexer 110 is a gate signal.

The demultiplexer 110 includes m unit circuits (DEMUX) 111. The unit circuit 111 has a function of a demultiplexer; therefore, the demultiplexer 110 can also be referred to as a demultiplexer group.

(Unit Circuit: DEMUX)

The DEMUX 11 has a function of generating a plurality of pulse signals (here, four pulse signals) from one input signal and sequentially outputting the plurality of generated pulse signals to a plurality of wirings. The operation is described by giving a DEMUX [L1] as an example. In accordance with four control signals PWCL1 to PWCL4, the DEMUX [L1] generates four pulse signals from the third pulse signal input thereto from a GSR [L1] and sequentially outputs these four pulse signals to gate lines GL_L1 to GL_L4.

In the GDL 21, to a DEMUX 111 [Lk], gate lines 31 in a (8k-7)-th row to a (8k-4)-th row are connected (k is an integer of 1 or more). Moreover, in the GDR 22, to a DEMUX 111 [Rk] (a k-th stage unit circuit 111), gate lines 31 in a (8k-3)-th row to a (8k)-th row are connected.

Note that although, in the example of FIG. 3, every four gate lines 31 are connected to the corresponding DEMUX 111, in general, every M gate lines 31 (M is an integer of 2 or more) can be connected to the corresponding DEMUX 111. In such a case, to the DEMUX 111 [Lk] (1≤k≤m, k is an integer), gate lines 31 in a (2Mk−2M+1)-th row to a (2Mk−M)-th row are connected. To the DEMUX 111 [Rk], gate lines 31 in a (2Mk−M+1)-th row to a (2Mk)-th row are connected. In accordance with M control signals, the corresponding DEMUX 111 selects one or more gate lines 31 and outputs an input signal from the GSR 101 to the selected gate line 31.

(Dummy Unit Circuit: dmyDEMUX)

The demultiplexer 110 includes a dummy unit circuit (dmyDEMUX) 112 connected to the dummy unit circuit (dmyGSR) 102. Two dummy gate lines 37 are connected to the dmyDEMUX 112. The dmyDEMUX 112 has a function similar to that of the DEMUX 111, i.e. a function of sequentially inputting an output signal of the dmyGSR 102 to the two dummy gate lines 37 in accordance with the two control signals PWCL1 and PWCL2.

Note that the dmyDEMUX 112 is not necessarily provided. When the dmyDEMUX 112 is provided, the dummy gate line 37 is not necessarily provided. When the dummy gate line 37 is provided, the pixel circuit 30 connected to the dummy gate line 37 may be provided in the pixel portion 20, or is not necessarily provided. When the pixel circuit 30 is provided, the pixel circuits 30 may be provided in all columns or some columns.

(Unit Circuit: PGC)

The GDL 21 and the GDR 22 are each a circuit including m unit circuits (PGC) 121 and one dummy unit circuit (dmyPGC) 122.

The PGC 121 is a circuit including the GSR 101 and the DEMUX 111, the dmyPGC is a circuit including the dmyGSR 102 and the dmyDEMUX 112. These circuits each have a function of generating a plurality of pulse signals. The PGC 121 is a circuit for outputting a gate signal to the plurality of gate lines 31, and the dmyPGC 122 is a circuit for outputting a gate signal to one or more dummy gate lines 37.

<Narrowed Frame>

As shown in FIG. 3, since gate signals can be output to the plurality of gate lines 31 from one-stage GSR 101 (one-stage PGC 121), an area occupied by a circuit and a wiring group per row can be reduced in each of the gate drivers 21 and 22. This is described with reference to FIGS. 4A and 4B.

Figure 4A:
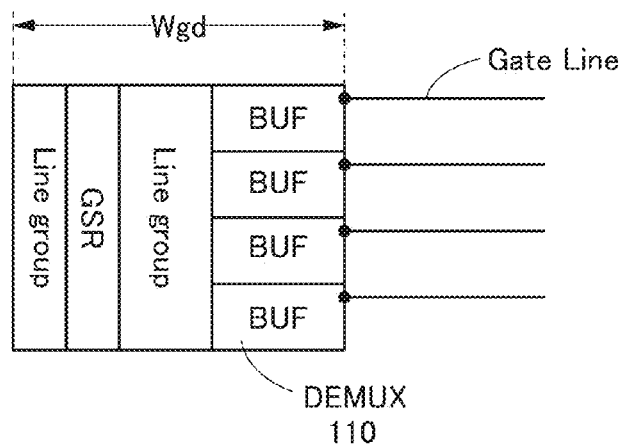
FIGS. 4A and 4B are schematic diagrams each illustrating arrangement examples of a wiring group and a circuit of a gate driver (FIG. 4A: example of one embodiment of the present invention, FIG. 4B: conventional example).
Figure 4B:
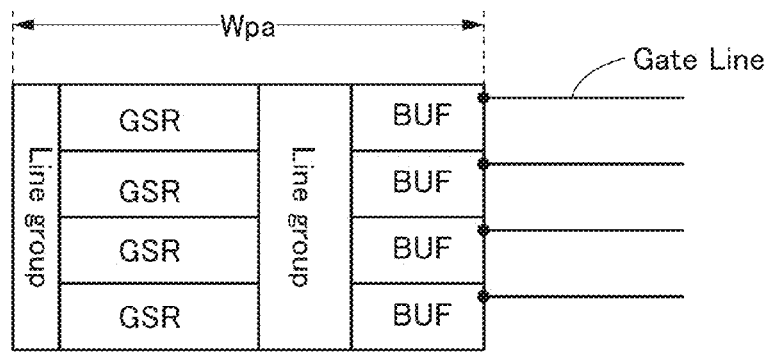

FIGS. 4A and 4B are schematic diagrams for illustrating a difference between this embodiment and a conventional example in the layout of the gate drivers. FIG. 4A 10 illustrates a layout example of the gate drivers in this embodiment, and FIG. 4B illustrates a layout example of the gate drivers in the conventional example. Note that the terms and reference numerals used in FIG. 3, FIG. 10B, and the like are used also in FIG. 4B for easy understanding.

In the conventional example, one-stage GSR is provided for one gate line. On the other hand, in this embodiment, one-stage GSR can be provided for four gate lines. Thus, a gate driver width Wgd of this embodiment is narrower than a gate driver width Wpa of the conventional example. That is, employment of the gate drivers 21 and 22 of this embodiment enables a frame width of the LCD 10 to be narrower.

<Gate Driver: Example of Driving Method of GDR and GDL>

Examples of the driving methods of the GDL 21 and the GDR 22 are described with reference to FIG. 5, FIG. 6, and FIG. 7. Moreover, partial driving by which data displayed on the pixel portion 20 (screen) of the LCD 10 is partly rewritten is also described.

Figure 5:
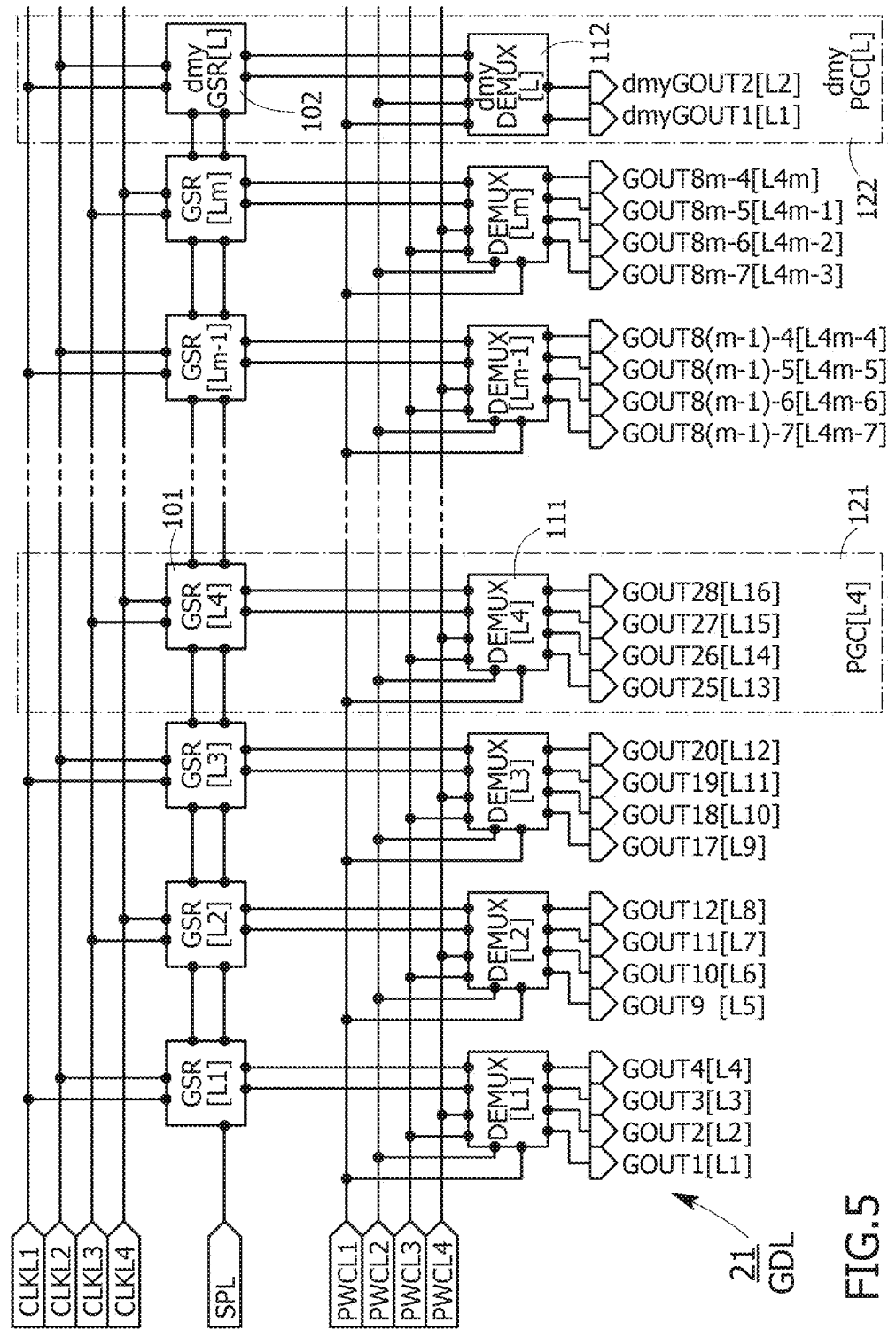
FIG. 5 is a block diagram illustrating a structural example of a gate driver (the left side).
Figure 6:
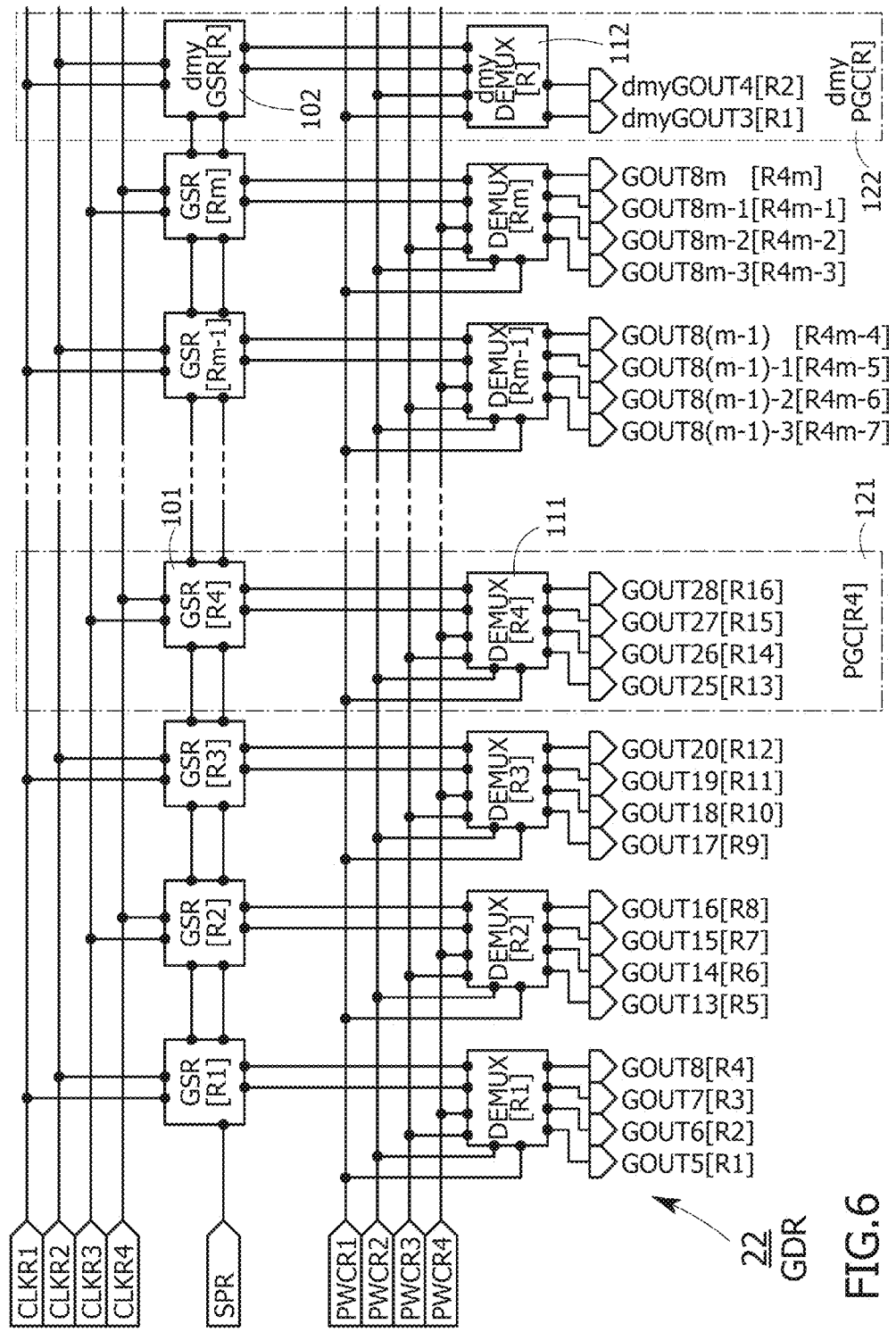
FIG. 6 is a block diagram illustrating a structural example of a gate driver (the right side).

FIG. 5 is a block diagram illustrating an example of a more specific structure of the GDL 21, and FIG. 6 is a block diagram illustrating an example of a more specific structure of the GDR 22. FIG. 7 is a timing chart of the GDL 21 and the GDR 22.

<Structural Examples of GDL and GDR>

Since the GDL 21 and the GDR 22 have similar structures as shown in FIG. 5 and FIG. 6, only the structure of the GDL 21 is described here. Clock signals CLKL1 and CLKL2 are input to the GSR 101 in odd-numbered stages, and clock signals CLKL3 and CLKL4 are input to the GSR 101 in even-numbered stages. To the dmyGSR 102, the clock signals CLKL1 and CLKL2 are input. Note that in the case where the clock signals CLKL1 and CLKL2 are input to the GSR 101 in the last stage, the clock signals CLKL3 and CLKL4 are input to the dmyGSR 102.

Note that in the description below, the "clock signal CLKL1" is abbreviated to a "signal CLKL1" or "CLKL1" in some cases. Voltage, a circuit, and a terminal as well as a signal are abbreviated in some cases.

The start pulse signal SPL is input to the GSR [L1]. The GSR 101 in each stage outputs the start pulse signal SPL which is shifted in accordance with the signal CLKL2 or CLKL4 to the GSR 101 in the next stage. Moreover, the GSR 101 and the dmyGSR 102 each output a reset signal to the GSR 101 in the previous stage in accordance with the signal CLKL1 or CLKL3.

To the DEMUX 111, the clock signals PWCL1 to PWCL4 and two signals generated in the GSR 101 are input. In accordance with the signals PWCL1 to PWCL4, the DEMUX 111 generates four pulse signals from a signal input from the GSR 101 and sequentially outputs the pulse signals to four output terminals. In FIG. 5, gate lines to which four output signals GOUT of the DEMUX 111 are output are distinguished by row numbers.

In accordance with the other output signal of the GSR 101, the DEMUX 111 outputs constant voltages to the four output terminals. That is, constant voltages are supplied to the four output terminals in a period during which a pulse signal (gate signal) is not generated in the DEMUX 111, whereby the voltage of the gate line 31 can be set to an L level during such a period. In such a manner, the voltage of the gate line 31 can be surely held at a voltage at which the pixel circuit 30 is not selected; therefore, high quality display can be obtained in the LCD 10.

To the dmyDEMUX 112, the signals PWCL1 and PWCL2 and two output signals from the dmyGSR 102 are input to output two dummy gate signals dmyGOUT, which is different from the DEMUX 111.

<Example of Driving Method of GDL and GDR>

Examples of the driving methods of the GDL and the GDR are described with reference to a timing chart in FIG. 7. FIG. 7 shows waveforms of the control signals input to the GDL 21 in FIG. 5 and the GDR 22 in FIG. 6 and the output signals of the GDL 21 and GDR 22. Note that in FIG. 7, output signals GOUT1 [L1] to GOUT4 [L4] from the GSR 101 [L1] are shown as the output signals of the GDL 21, and output signals GOUT5 [R1] to GOUT8 [R4] from the GSR 101 [R1] are shown as the output signals of the GDR 22.

Note that FIG. 7 is a timing chart in the case where the transistor 34 of the pixel circuit 30 is an n-channel transistor in which case the gate line 31 is selected by an input of a gate signal (GOUT) at a high level (H level) to the gate line 31.

To the GDL 21, the start pulse signal SPL, the clock signals CLKL1 to CLKL4, and the clock signals PWCL1 to PWCL4 are input. To the GDR 22, the start pulse signal SPR, the clock signals CLKR1 to CLKR4, and the clock signals PWCR1 to PWCR4 are input.

[Input Signal of Shift Register]

The CLKL1 to CLKL4 are clock signals having the same cycles as the CLKR1 to CLKR4.

The CLKL1, CLKL3, CLKR1, and CLKR3 are each a signal having the same waveform with a pulse width of a 1/2 cycle. The CLKL3 is an inversion signal of the CLKL1, and the CLKR3 is an inversion signal of the CLKR1. The CLKR1 is a signal whose phase is delayed from the CLKL1 by a 1/4 cycle. This phase delay is the same as the phase delay of the signal SPR from the signal SPL.

The CLKL2, CLKL4, CLKR2, and CLKR4 are each a signal having the same waveform with a pulse width the same as those of the start pulse signals SPL and SPR (in a period during which the signals are at an H level), which is a 3/8 cycle.

The CLKL2 is a signal that is at an H level in a period during which the CLKL1 is at an H level, and the CLKL1 and CLKL2 fall at the same timing. The CLKL4 is a signal that is at an H level in a period during which the CLKL3 is at an H level, and the CLKL3 and CLKL4 fall at the same timing. The same applies to the CLKR2 and CLKR4.

[Input Signal Of Demultiplexer]

The signals PWCL1 to PWCL4 and the signals PWCR1 to PWCR4 are each a clock signal for determining the timing at which an H-level signal is output from the DEMUX 111 to the gate line 31. Therefore, partial driving is possible by changing some pulse widths of the signals PWCL1 to PWCL4 and the signals PWCR1 to PWCR4.

In normal driving, the signals PWCL1 to PWCL4 and the signals PWCR1 to PWCR4 are clock signals each having the same cycle and the same pulse width, and the cycles are 1/2 cycles of the signals CLKL1 to CLKL4 and the signals CLKR1 to CLKR4. As shown in FIG. 7, in the order of the signals PWCL1 to PWCL4 and in the order of the signals PWCR1 to PWCR4, a pulse of one signal overlaps with a pulse of a subsequent signal. Here, the length of a period where pulses overlap with each other is a 1/2 pulse width. Thus, in the case where the PWCL1 serves as a reference, the phase delays of other signals are as follows: the PWCL2 is a 1/2 pulse width thereof, the PWCL3 is a 2/2 pulse width thereof, and the PWCL4 is a 3/2 pulse width thereof. Further, the phase delays of the PWCR1 is a 4/2 pulse width of the PWCL1, the PWCR2 is a 5/2 pulse width thereof, the PWCR3 is a 6/2 pulse width thereof, and the PWCR4 is a 7/2 pulse width thereof.

In a period ToutL1, the DEMUX [L] distributes the input signal from the GSR [L1] to four output terminals and outputs the GOUT1 to the GOUT4. The period ToutL1 starts at rising of the CLKL1 and terminates at rising of the CLKL2. In a period during which the PWCL1 is at an H level, the DEMUX [L1] outputs the GOUT1 at an H level. In a similar manner, the DEMUX [L1] outputs the GOUT2, GOUT3, and GOUT4 by inputs of the PWCL2, PWCL3, and PWCL4 at an H level, respectively.

In a period ToutR1, the DEMUX [R1] operates in a manner similar to that of the DEMUX [L] and outputs the GOUT5 to the GOUT8.

By such an operation of the demultiplexer 110, the gate signals GOUT1, GOUT2, GOUT3, GOUT4, GOUT5, GOUT6, GOUT7, and GOUT8 are output to the gate lines GL_1, GL_2, GL_3, GL_4, GL_5, GL_6, GL_7, and GL_8, respectively, with a phase delay being a 1/2 pulse width of each gate signal.

[Partial Driving]

In order to perform partial driving, the GDL 21 and GDR 22 may be driven so that gate signals GOUT at en H level are output only to some gate lines 31. In this embodiment, partial driving is achieved by controlling the pulse widths of the signals PWCL1 to PWCL4 and the signals PWCR1 to PWCR4.

Specifically, in a certain period during one frame period, in which the pulse widths of some or all of the signals PWCR1 to PWCR4 and the signals PWCL1 to PWCL4 are set to zero, the signals are set at an L level. Such signals in one or more rows of the gate lines 31 which are selected in this period are not at an H level; therefore, data displayed on the pixel circuits 30 in such row(s) cannot be rewritten. For example, the pixel circuits 30 in the fifth to eighth rows are not selected when the PWCR1 to PWCR4 are at an L level in the period ToutR1; therefore, data displayed on the pixel circuits 30 in such rows are not rewritten and an image in a pervious frame period is to be displayed.

As described above, employment of the gate drivers of this embodiment enables a display device having a narrowed frame and partial driving of the display device.

Single conductivity type transistors can be included in the gate drivers of this embodiment. A specific circuit structure of such a gate driver will be described below in Embodiment 2.

Embodiment 2

In this embodiment, the circuit structures of the unit circuits GSR, dmyGSR, DEMUX, and dmyDEMUX included in the GDL 21 and GDR 22 will be described. Here, an example in which an n-channel transistor is included in each of the unit circuits GSR, dmyGSR, DEMUX, and dmyDEMUX is shown.

Note that in this embodiment, in some cases, input signals and output signals in the GDL 21 and GDR 22 are not distinguished for simple description. In such a case, signals CLKL1 to CLKL4 and signals CLKR1 to CLKR4 are abbreviated to CLK1 to CLK4. Moreover, in some cases, the same term is used for both a terminal and a signal for easy understanding of the structures and operations of circuits.

<Structural Example 1 of GSR>

FIG. 8A is a circuit diagram illustrating a structural example of the GSR 101, and FIG. 8B is a block diagram of the GSR 101.

The GSR 101 includes four input terminals CK1, CK2, SETIN, and RESIN and four output terminals SROUT(S), SROUT (R), FNOUT1, and FNOUT2.

The terminal CK1 is an input terminal of the clock signal CLK1 or CLK3, and the terminal CK2 is an input terminal of the clock signal CLK2 or CLK4.

The terminal SETIN is an input terminal to which a set signal SRSET of the GSR 101 is input, and the SROUT(S) is an output terminal from which the set signal is output. The voltage change in a node FNS is output from the terminal SROUT(S) as the signal SRSET. The terminal SETIN is connected to the terminal SROUT(S) in the previous stage. Note that a start pulse signal SP is input to the SETIN in a first stage. The terminal SROUT(S) in the last stage is connected to the terminal SETIN of the dmyGSR 102.

The terminal RESIN is an input terminal to which a reset signal SRRES of the GSR 101 is input, and the SROUT(R) is an output terminal from which the reset signal is output. The terminal RESIN is connected to the terminal SROUT(R) in the next stage. The terminal RESIN in the last stage is connected to the terminal SROUT(R) of the dmyGSR 102.

The terminals FNOUT1 and FNOUT2 are connected to the DEMUX 111.

The GSR 101 includes eight transistors M1 to M8. Here, a source and a drain of the transistor are distinguished for easy understanding of the structures and operations of circuits. However, in some cases, the functions of the source and drain of the transistor are interchanged depending on voltage supplied to the transistor. Thus, in the semiconductor device of one embodiment of the present invention, the distinction between the source and drain of the transistor is not limited to that described in this embodiment. Here, the circuit of the GSR 101 includes n-channel transistors; therefore, a terminal (electrode) to which a signal at an H level and a power source voltage are mainly input is referred to as a drain, and a terminal (electrode) to which a signal at an L level and a power source voltage are mainly input is referred to as a source.

As the power source voltage, a high power source voltage VDD and a low power source voltage VSS are supplied to the GSR 101. Wirings 201 and 202 for supplying the power source voltages VDD and VSS are included. Drains of the transistors M1 and M3 are connected to the wiring 201. Sources of the transistors M2, M4, M6, and M8 are connected to the wiring 202. Drains of the transistors M5 and M7 are connected to the terminals CK1 and CK2.

Here, a drain of the transistor M2 is regarded as a node FN1, and a gate of the transistor M2 is regarded as a node FN2. The FN1 and FN2 are connected to the DEMUX 111, and the voltage changes in the FN1 and FN2 are output to the DEMUX 111 as signals. As will be described later, the FN1 is a node whose voltage gets higher than that of a VDD by a bootstrap effect.

The transistor M1 functions as a circuit that changes the node FN1 to an H level, and the transistor M2 functions as a circuit that changes the node FN1 to an L level. The transistor M1 connects the wiring 201 and the FN1, and the set signal SRSET is input from the terminal SETIN to a gate of the transistor M1. The transistor M2 connects the FN1 and the wiring 202, and the gate of the transistor M2 is connected to the FN2.

The transistor M3 functions as a circuit that changes the node FN2 to an H level, and the transistor M4 functions as a circuit that changes the node FN2 to an L level. The transistor M3 connects the wiring 201 and the FN2, and the reset signal SRRES is input from the terminal RESIN to a gate of the transistor M3. The transistor M4 connects the FN2 and the wiring 202, and the set signal SRSET is input from the terminal SETIN to the gate of the transistor M4.

The transistor M5 functions as a circuit that changes a node FNR to an H level, and the transistor M6 functions as a circuit that changes the node FNR to an L level. Here, a source of the transistor M5 is regarded as the node FNR. The transistor M5 connects the FNR and the terminal CK1 to which the clock signal CLK1 or CLK3 is input, and a gate of the transistor M5 is connected to the FN1. The transistor M6 connects the FNR and the wiring 202, and a gate of the transistor M6 is connected to the FN2.

The transistor M7 functions as a circuit that changes the node FNS to an H level, and the transistor M8 functions as a circuit that changes the node FNS to an L level. Here, a source of the transistor M7 is regarded as the node FNS. The transistor M7 connects the FNS and the terminal CK2 to which the clock signal CLK2 or CLK4 is input, and a gate of the transistor M7 is connected to the FN1. The transistor M8 connects the FNS and the wiring 202, and a gate of the transistor M8 is connected to the FN2.

<Structural Example 1 of dmyGSR>

Figures 9A, 9B:
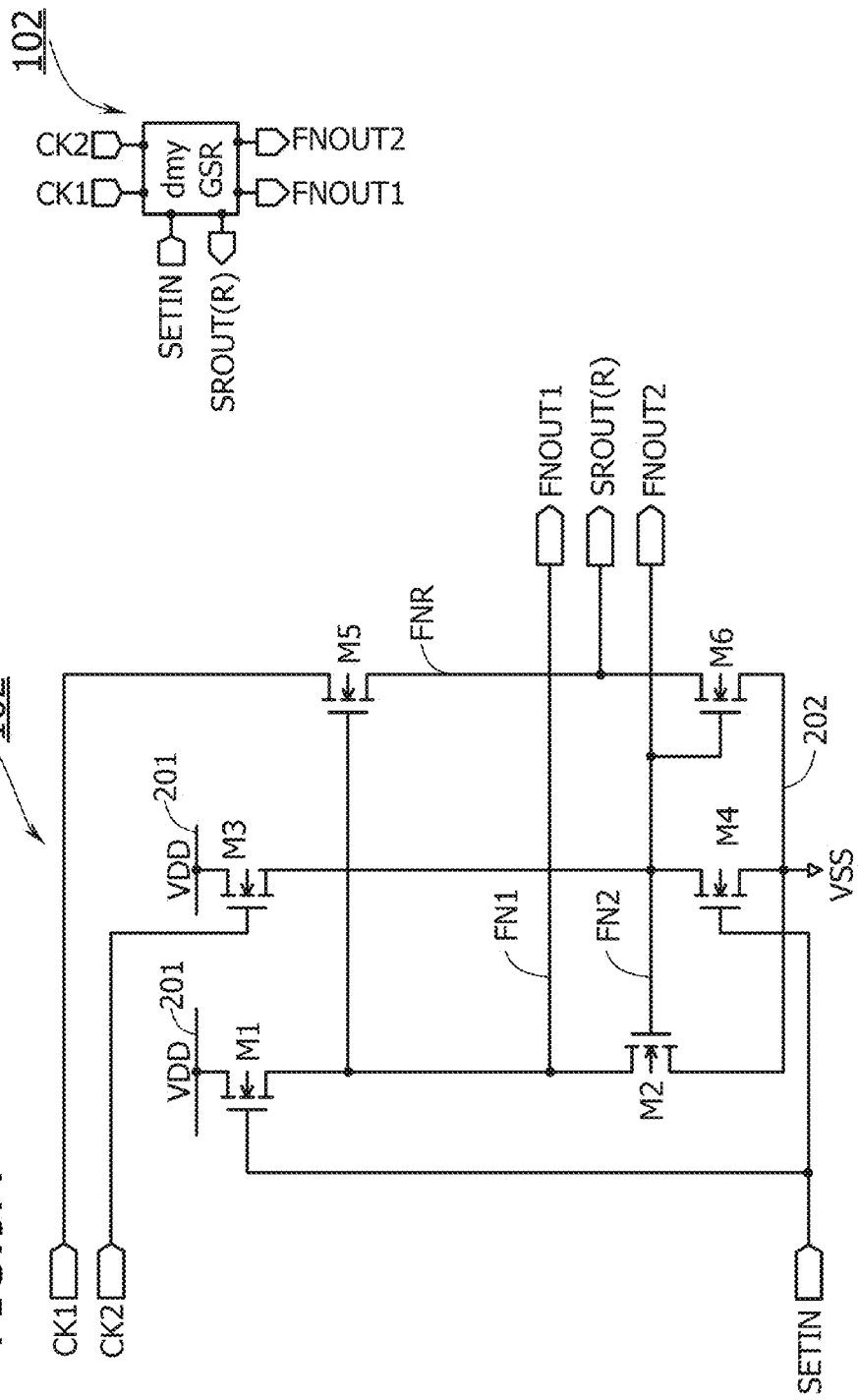
FIG. 9A is a circuit diagram illustrating a structural example of a dummy unit circuit (dmyGSR)
FIG. 9B is a block diagram thereof.

FIG. 9A is a circuit diagram illustrating a structural example of the dmyGSR 102, and FIG. 9B is a block diagram of the dmyGSR 102.

The dmyGSR 102 is a circuit in which some elements of the GSR 101 are removed because some functions of the GSR 101 are not necessary. The dmyGSR 102 does not output a set signal; therefore, the terminals SROUT(S) and RESIN and the transistors M7 and M8 are not included. The dmyGSR 102 differs from the GSR 101 in that the gate of the transistor M3 is connected to the terminal CK2. Although the clock signal CLK2 is input to the terminal CK2 of the dmyGSR 102 in the structural examples of the GDL 21 in FIG. 5 and the GDR 22 in FIG. 6, a reset signal can be input to the terminal CK2 from outside.

<Structural Examples 1 of DEMUX and dmyDEMUX>

Figure 10C:
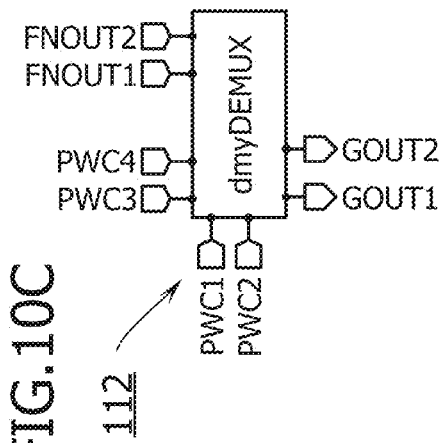
FIGS. 10C and 10D are block diagrams each illustrating a structural example of a dummy unit circuit (dmyDEMUX).
Figure 10D:
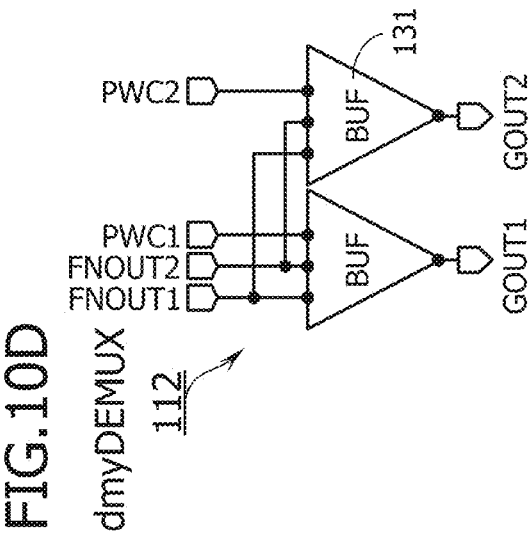
Figure 10A:
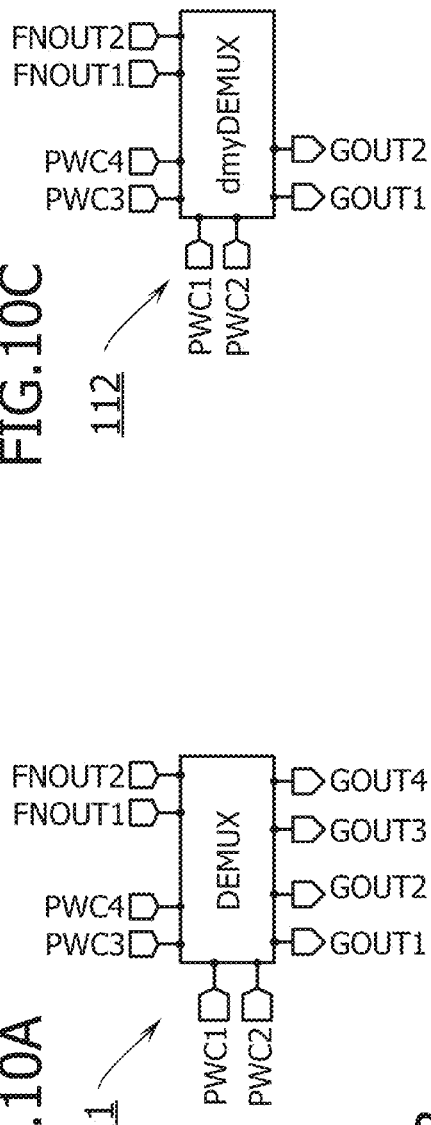
FIGS. 10A and 10B are block diagrams each illustrating a structural example of a unit circuit (DEMUX)
Figure 10B:
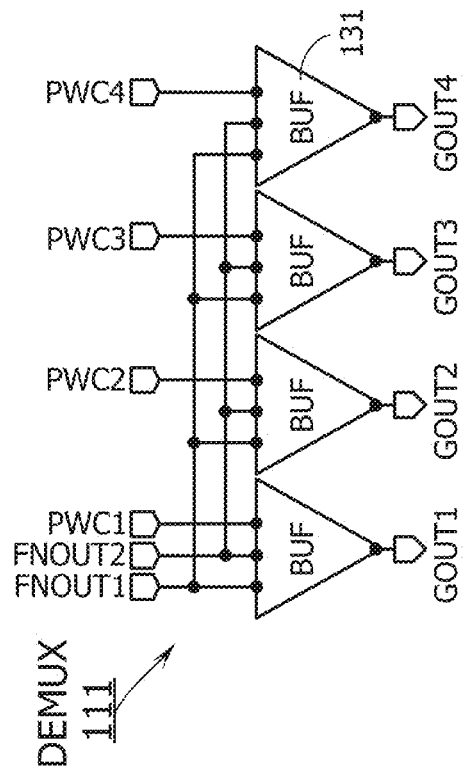

FIGS. 10A and 10B are block diagrams of the DEMUX 111, and FIGS. 10C and 10D are block diagrams of the dmyDEMUX 112.

The input terminals FNOUT1 and FNOUT2 of the DEMUX 111 are connected to the GSR 101, and signals PWC1 to PWC4 are input to input terminals PWC1 to PWC4. The gate lines 31 are connected to the output terminals GOUT1 to GOUT4. Moreover, the DEMUX 111 includes four unit circuits (BUF) 131 (FIG. 10B). Note that in the DEMUX 111, the four unit circuits BUF 131 are referred to as BUF1 to BUF4 for distinction.

The dmyDEMUX 112 includes two unit circuits BUF (BUF1 and BUF2) 131 to output pulse signals to two dummy gate lines (dmyGL) (FIG. 10D).

As shown in FIG. 10B, the output terminals FNOUT1 and FNOUT2 of the GSR 101 are connected to the BUF1 to BUF4 of the DEMUX 111. The signals PWC1, PWC2, PWC3, and PWC4 are input to terminals PWC of the BUF1, BUF2, BUF3, and BUF4, respectively. A unit circuit from which a signal input from the FNOUT1 (the voltage of the FN1) is output is selected from the BUF1 to BUF4. Moreover, the voltage of the output terminals GOUT1 to GOUT4 is set at an L level in accordance with a signal input from the FNOUT2.

<Structural Example 1 of BUF>

Figure 11A:
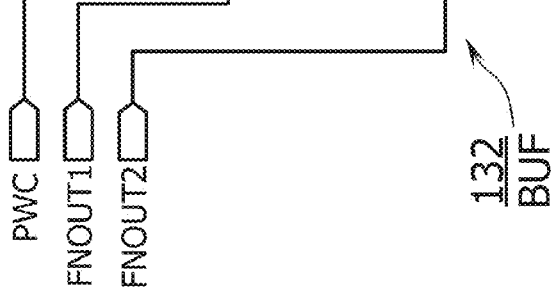
FIG. 11A is a block diagram illustrating a structural example of a unit circuit (BUF)
Figure 11B:
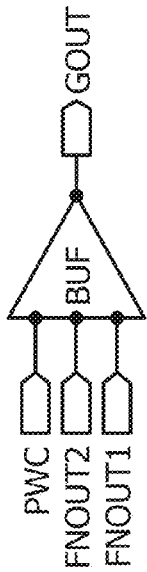
FIGS. 11B and 11C are circuit diagrams thereof.
Figure 11C:
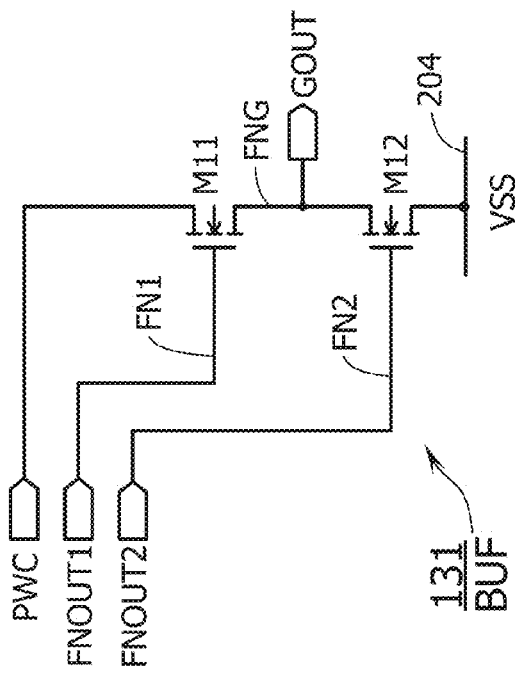

FIG. 11A is a block diagram of the BUF 131, and FIG. 11B is a circuit diagram illustrating a structural example of the BUF 131. Note that FIG. 11C is a circuit diagram illustrating another structural example of the BUF 131, which will be described later.

The BUF 131 is a circuit which outputs the voltage change in a node FNG from a terminal GOUT as a signal. The BUF 131 functions as a buffer circuit, and has a function of outputting the signal input from the terminal FNOUT1 from the terminal GOUT in accordance with a signal input to a terminal PWC. Moreover, the BUF 131 has a function of changing the terminal GOUT to an L level in accordance with a signal input to the terminal FNOUT2.

The BUF 131 includes two transistors M111 and M12 connected in series. The transistor M11 has a function of changing the node FNG to an H level, and the transistor M12 has a function of discharging the node FNG to be changed to an L level. The transistor M11 connects the terminal PWC and the FNG, and a gate of the transistor M11 is connected to the terminal FNOUT1 (a node FN1). The transistor M12 connects the FNG and a wiring 204, and a gate of the transistor M12 is connected to the terminal FNOUT2 (a node FN2).

The BUF 131 is supplied with VSS from the wiring 204. Note that the wiring 204 may be used in common with the wiring 202 of the GSR 101.

Note that there is also a case where in each of the GDL 21 and GDR 22, instead of one transistor, a plurality of transistors connected in series and/or in parallel for the purpose of adjusting channel widths or channel lengths thereof are used as the transistors M1 to M8, M11, and M12. The same applies to another structural example which will be described later.

<Operation Examples of GSR and DEMUX>

Operation examples of the GSR 101 and DEMUX 111 are described below with reference to FIG. 12. FIG. 12 is a timing chart of the GDL 21. Here, the operations of the GSR 101 and DEMUX 111 are described by giving the GDL 21 as an example, and the GDR 22 operates in the same manner.

FIG. 12 shows waveforms of the input signals CLKL1 to CLKL4 and SPL of the shift register 100 and the input signals PWCL1 to PWCL4 of the demultiplexer 110. The voltages of these input signals at an H level are VDD, and those at an L level are VSS. Note that VDD are voltages that can turn on the transistors M1 to M8, M11, and M12 by being input to gates of the transistors M1 to M8, M11, and M12. Moreover, VSS can turn off these transistors.

Further, FIG. 12 shows output signals SRSET, SRRES, ΦFN1, and ΦFN2 of the GSR [L1] to the GSR [L3] and output signals GOUT of the DEMUX [L1] and the DEMUX [L2]. The signals SRSET and SRRES correspond to the voltage changes in the nodes FNS and FNR of the GSR 101, respectively. Note that the ΦFN1 and ΦFN2 correspond to the voltage changes in the nodes FN1 and FN2, respectively. Further, FIG. 12 shows the output signals SRSET, SRRES, ΦFN1, and ΦFN2 of the GSR [L1] to the GSR [L3] and output signals GOUT of the DEMUX [L1] and the DEMUX [L2] in a period t0-t9.

<<Operation of Shift Register>>

First, the operations of the GSR [L1] to the GSR [L3] (the shift register 100) are described.

<Initial State: Period t0-t1>

The nodes FN1, FN2, FNR, and FNS of the GSR [L1] to the GSR [L3] are each in an initial state by a reset operation in one frame period before. An initial state is a state in which only the node FN2 is at an H level and other nodes are each at an L level.

<Set Operation: t1-t2>

The signal SPL is input to the terminal SETIN of the GSR [L1]. The transistor M4 is turned on, and a node FN2_L1 is changed to an L level. At the time t2, the terminal SETIN is changed to an L level and the transistor M4 is turned off; therefore, the FN2_L1 is in an electrically floating state.

Moreover, by the input of the signal SPL, the transistor M1 is turned on and the FN1 is changed to an H level in the GSR [L1]. The voltage of the FN1 is lower than that of VDD by a threshold voltage of the transistor M1. After the time t2, the transistor M1 is turned off.

<Bootstrap Operation: t2-t3>

In a period t2-t3, a bootstrap operation in which the voltage of the gate of the transistor M5 (FN1) in the GSR [L1] is made higher than that of VDD is performed. The drain of the transistor M5 is at an H level by the signal CLKL1. The FN1 is at an H level; therefore, the transistor M5 is on and VDD is applied to the drain thereof. The voltages of the source and drain of the transistor M5 are VDD. The voltage of the gate of the transistor M5 (ΦFN1_L1) gets higher than that of VDD because of a bootstrap effect by a capacitance between the gate and the source and a capacitance between the gate and the drain.

<Generation of Set Signal: t3-t4>

A set signal SRSET_L1 is generated in the GSR [L1]. The transistor M7 is turned on by inputting the CLKL2 at an H level to the terminal CK2 so that the node FNS is changed to an H level. The voltage of the FNS is input to a terminal SETIN of the GSR [L2] in a next stage as the signal SRSET_L1 at an H level. That is, in the shift register 100, a shift operation of transferring a start pulse signal SPL to the GSR [L2] in a next stage is performed. Moreover, in the GSR [L2], the above set operation is started by the input of the SRSET_L1.

<Generation of Reset Signal: t2-t4>

In a period during which the CLKL1 is at an H level, the GSR [L1] generates a reset signal SRRES_L1. The terminal CK1 is supplied with VDD with the transistor M6 being on; therefore, the node FNR is at an H level.

<Reset Operation: t4-t6>

In this period, a reset signal SRRES_L2 is generated in the GSR [L2] and is output to the GSR [L1]. The reset operation of the GSR [L1] is performed with input of the SRRES_L2 at an H level serving as a trigger. When the transistor M3 is turned on, the FN2 is changed to an H level. Thus, the transistor M2 is turned on. When the transistor M2 is turned on, the FN1 is changed to an L level. In a period t6, the SRRES_L2 is changed to an L level, whereby the nodes FN1, FN2, FNR, and FNS are each in an electrically floating state. Such a voltage level is maintained until a signal SPL is input to the terminal SETIN. The node FN2 is changed to an H level and the nodes FN1, FNR, and FNS are changed to an L level by the reset operation.

As shown in FIG. 12, in the GSR [L1], when the FN2 is at an L level, the FN1 is at an H level, and when the FN2 is at an H level, the FN1 is at an L level. The GSR [L1] outputs two pulse signals, the voltage levels of which have an inverted relationship, to the DEMUX [L1].

The above operations are sequentially performed in the GSR [L2] and the GSR [L3].

<<Operation of Demultiplexer>>

Next, the operations of the DEMUX [L1] and the DEMUX [L2] (the demultiplexer 110) are described.

In the DEMUX 111 (BUF1 to BUF4), when one of the terminals FNOUT1 and FNOUT2 is at an H level, the other terminal is at an L level by the operation of the GSR 101. Thus, as seen from the circuit diagram of the BUF 131 in FIG. 11B, when one of the transistors M11 and M12 of the BUF 131 is turned on, the other transistor is turned off. Accordingly, the level of the node FNG of the BUF 131 is controlled by the voltage of the terminal PWC in a period during which the transistor M11 is on, whereas the level of the node FNG is changed to an L level because VSS is supplied to the node FNG from the wiring 202 in a period during which the transistor M12 is on.

Specifically, as shown in FIG. 12, signals GOUT [L1] to GOUT [L4] are output from a DEMUX 111 [L1] (BUF1 [L1] to BUF4 [L1]) in the period t2-t3, and signals GOUT [L5] to GOUT [L8] are output from a DEMUX [L2] (BUF1 [L2] to BUF4 [L2]) in the period t4-t6.

As shown in FIG. 12, a period during which the DEMUX [L1] and the DEMUX [L2] output the signals GOUT at an H level is also a period during which bootstrap operations of the GSR [L1] and the GSR [L2] are performed. In such a bootstrap period, the voltage of the signal GOUT (the voltage of the FNG) can be prevented from being lower than that of VDD because the signal GOUT at an H level is made output. Therefore, the pixel circuits 30 in the selected row can be surely connected to the source line; thus, high quality display can be obtained in the LCD 10.

Other structural examples of the GSR 101 and BUF 131 are described below.

<Structural Examples 2 and 3 of GSR>

Figure 13:
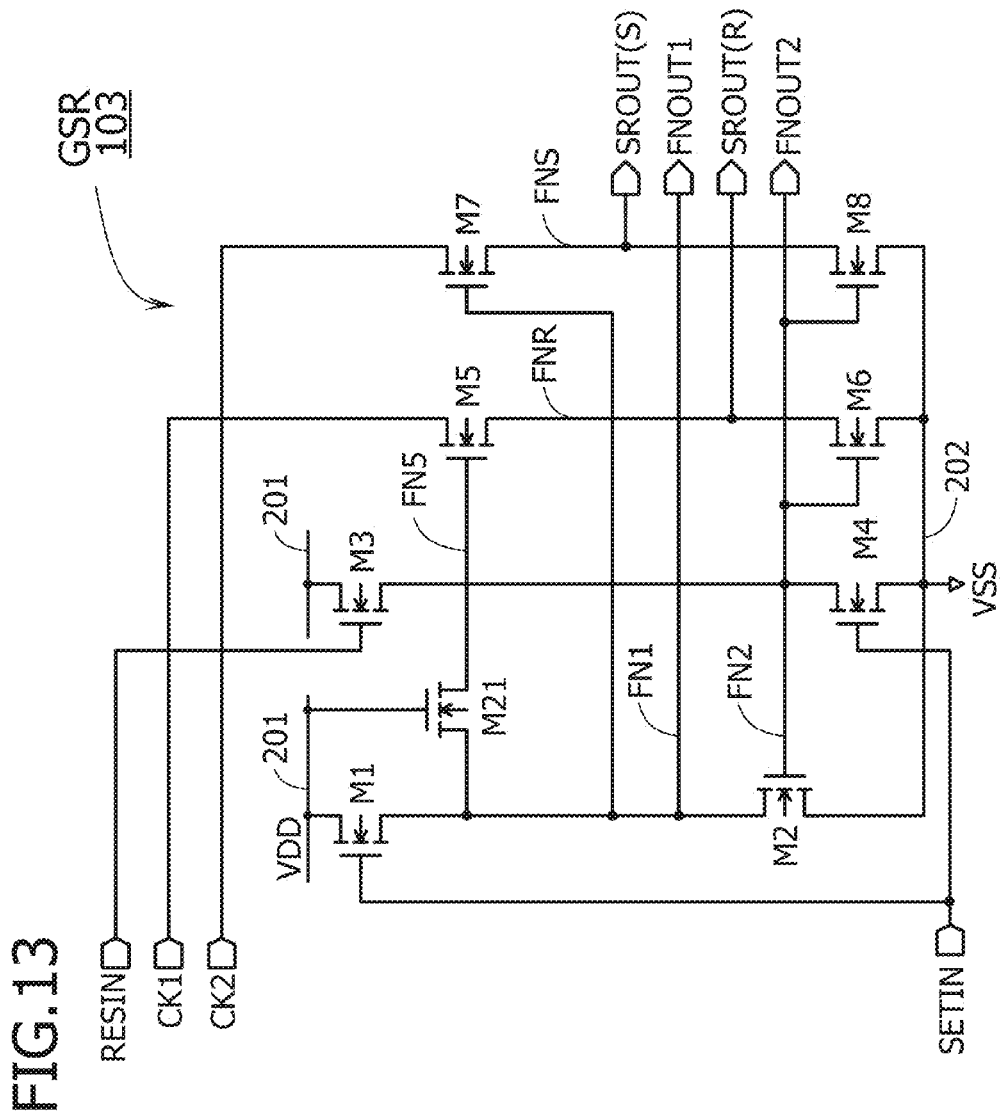
FIG. 13 is a circuit diagram illustrating a structural example of a unit circuit (GSR).

FIG. 13 is a circuit diagram illustrating a structural example of the GSR 101. A unit circuit (GSR) 103 is a circuit corresponding to the GSR 101 to which a transistor M21 is added. The transistor M21 connects the node FN1 and the gate of the transistor M5, and the wiring 201 supplied with VDD is connected to a gate of the transistor M21. That is, the transistor M21 is a switch that is always on. With the transistor M21, deterioration of the transistor M2 can be suppressed.

Figure 14:
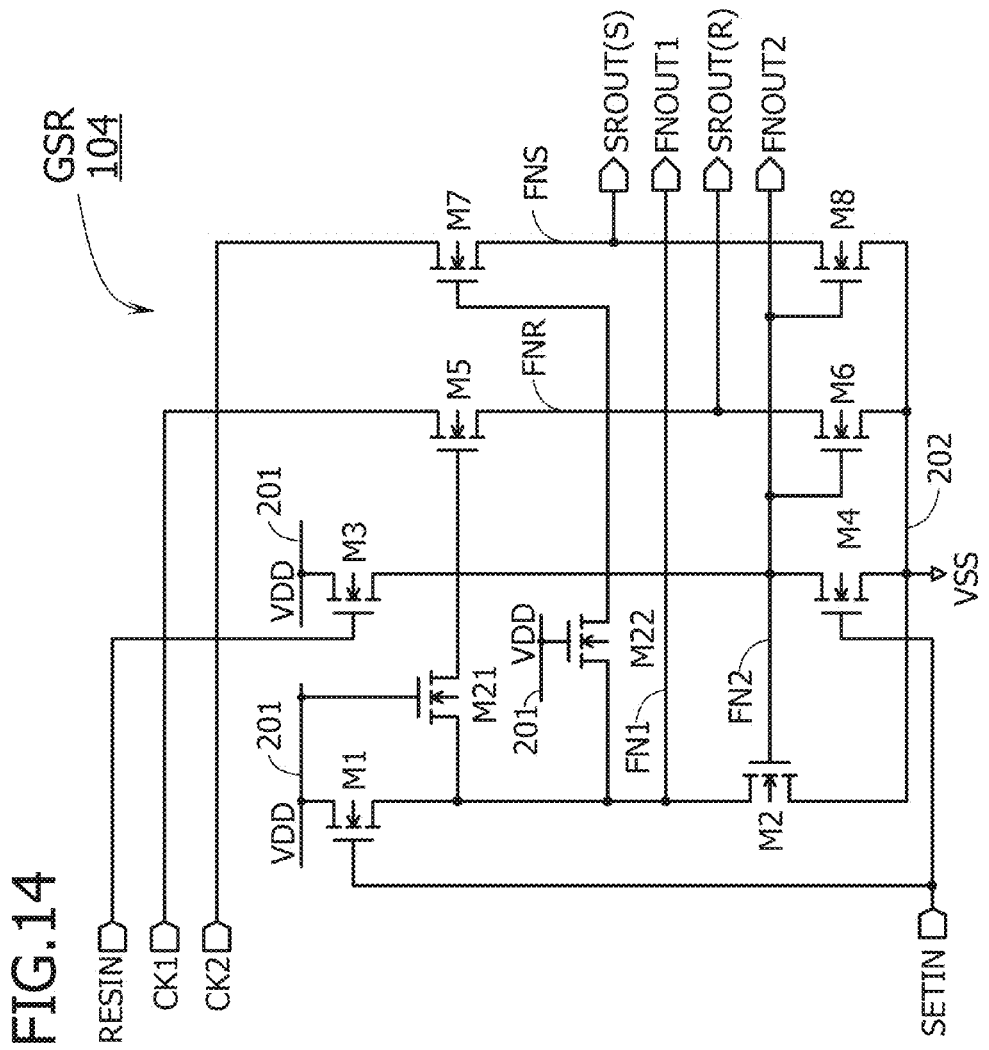
FIG. 14 is a circuit diagram illustrating a structural example of a unit circuit (GSR).

Alternatively, as in a unit circuit (GSR) 104 of FIG. 14, a transistor M22 for connecting the node FN1 and the gate of the transistor M7 may be further provided for the purpose of preventing deterioration of the transistor M2. A gate of the transistor M22 is connected to the wiring 201 supplied with VDD. Further alternatively, a structure without the transistor M21 may be employed for the GSR 104. The block diagrams of the GSR 103 and the GSR 104 are the same as that of the GSR 101 in FIG. 8B.

<Structural Example 4 of GSR>

Figure 15B:
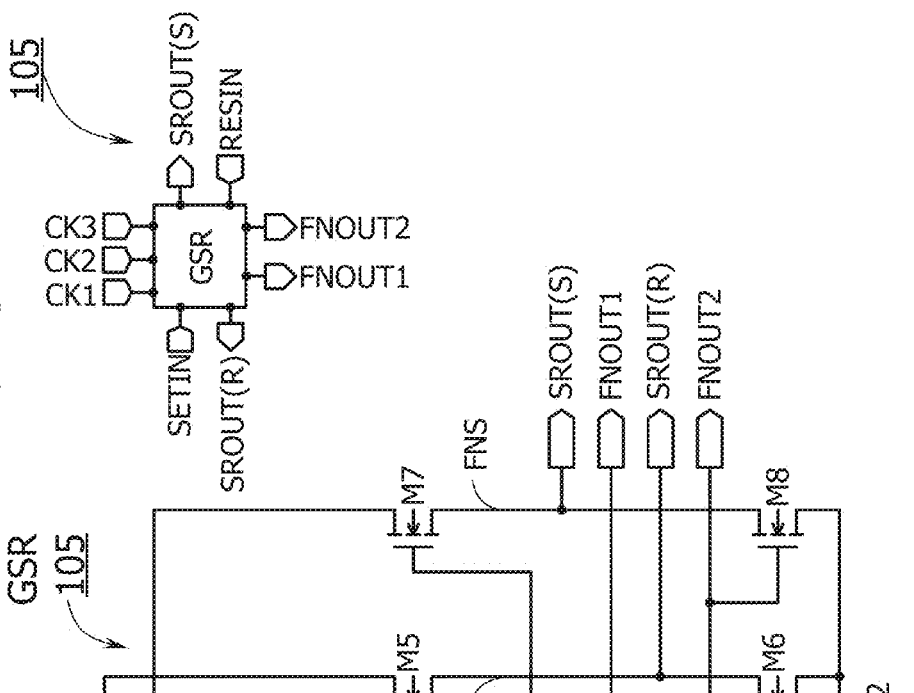
FIG. 15B is a block diagram thereof.
Figure 15A:
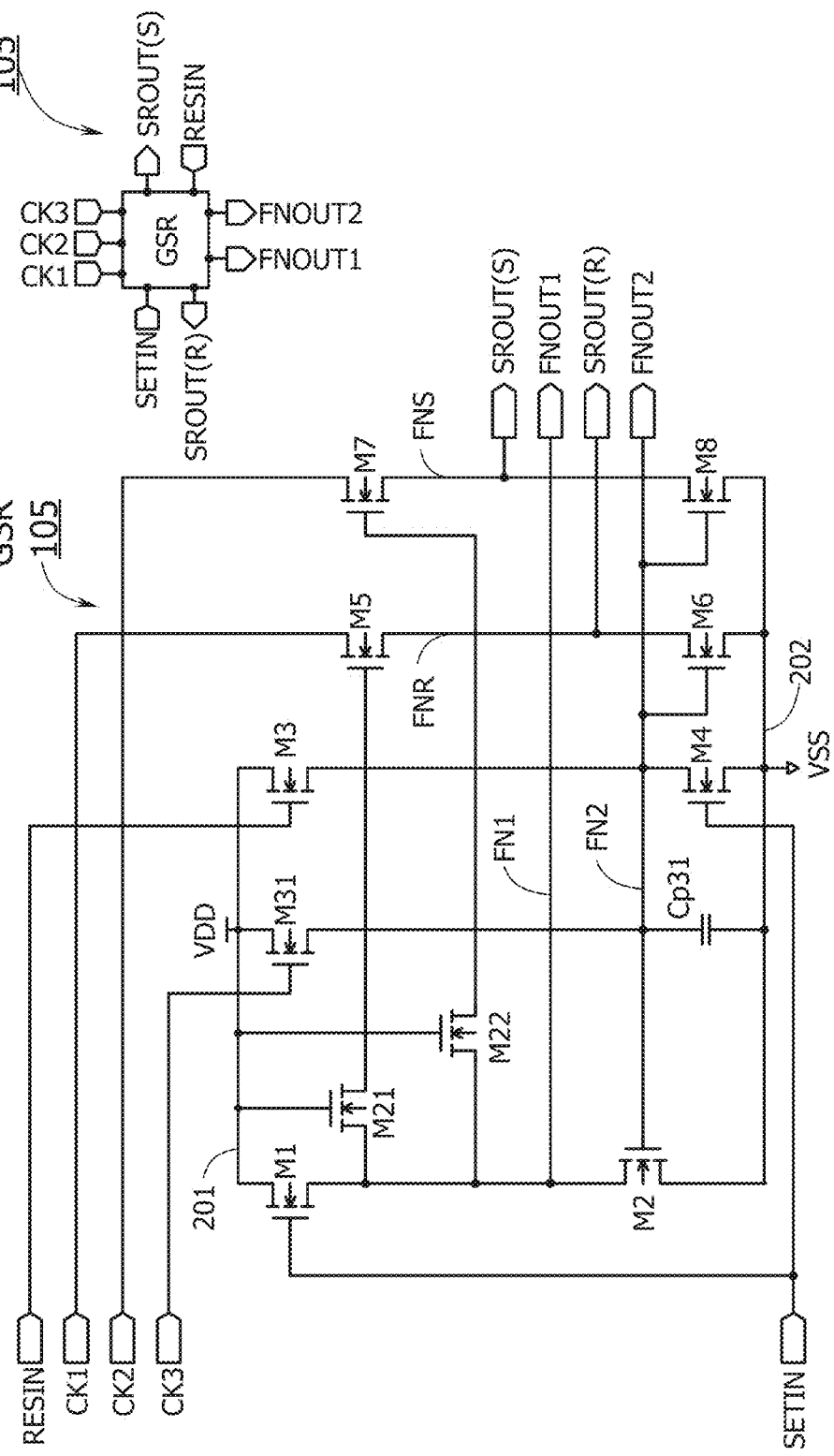
FIG. 15A is a circuit diagram illustrating a structural example of a unit circuit (GSR)

As shown in FIG. 12, the voltage of the node FN2 of the GSR 101 is at an H level in most of the periods. Therefore, the GSR 101 may be provided with a circuit for regularly charging the node FN2 to suppress voltage drop of the node FN2. FIG. 15A is a circuit diagram of a unit circuit (GSR) having such a circuit, and FIG. 15B is a block diagram of the GSR.

As shown in FIG. 15A, a unit circuit (GSR) 105 is a circuit corresponding to the GSR 104 to which an input terminal CK3, a transistor M31, and a capacitor Cp31 are added. The transistor M31 connects the wiring 201 and the node FN2, and the terminal CK3 is connected to a gate of the transistor M31. An inverted clock signal of a clock signal input to the terminal CK1 is input to the terminal CK3. That is, in the case where the clock signals CLKL1 and CLKR1 are input to the terminal CK1, the clock signals CLKL3 and CLKR3 are input to the terminal CK3, and in the case where the clock signals CLKL3 and CLKR3 are input to the terminal CK1, the clock signals CLKL1 and CLKR1 are input to the terminal CK3.

The capacitor Cp31 connects the node FN2 and the wiring 202 and functions as a storage capacitor of the node FN2. A structure without the capacitor Cp31 may be employed for the GSR 105.

The operation of the transistor M31 of the GSR 105 is described with reference to the timing chart of FIG. 12. The on or off state of the transistor M31 is controlled by the signal CLKL3 in the GSR [L1]. In the GSR [L1], the transistor M31 is turned on every time the signal CLKL3 is changed to an H level, which enables voltage rise of the FN2 to VDD. Since the FN2 is regularly supplied with VDD in the GSR 105 in this manner, the gate line 31 can be surely changed to an L level in a non-selected period and accordingly high quality display can be obtained in the LCD 10.

<Structural Example 5 of GSR>

A unit circuit (GSR) 106 shown in FIG. 16A is a circuit corresponding to the GSR 105 to which an input terminal INIRES and a transistor M41 are added. FIG. 16B is a block diagram of the GSR 106. The transistor M41 serves as a switch which connects the wiring 201 and the node FN2, and the input terminal INIRES is connected to a gate of the transistor M41.

Figure 17:
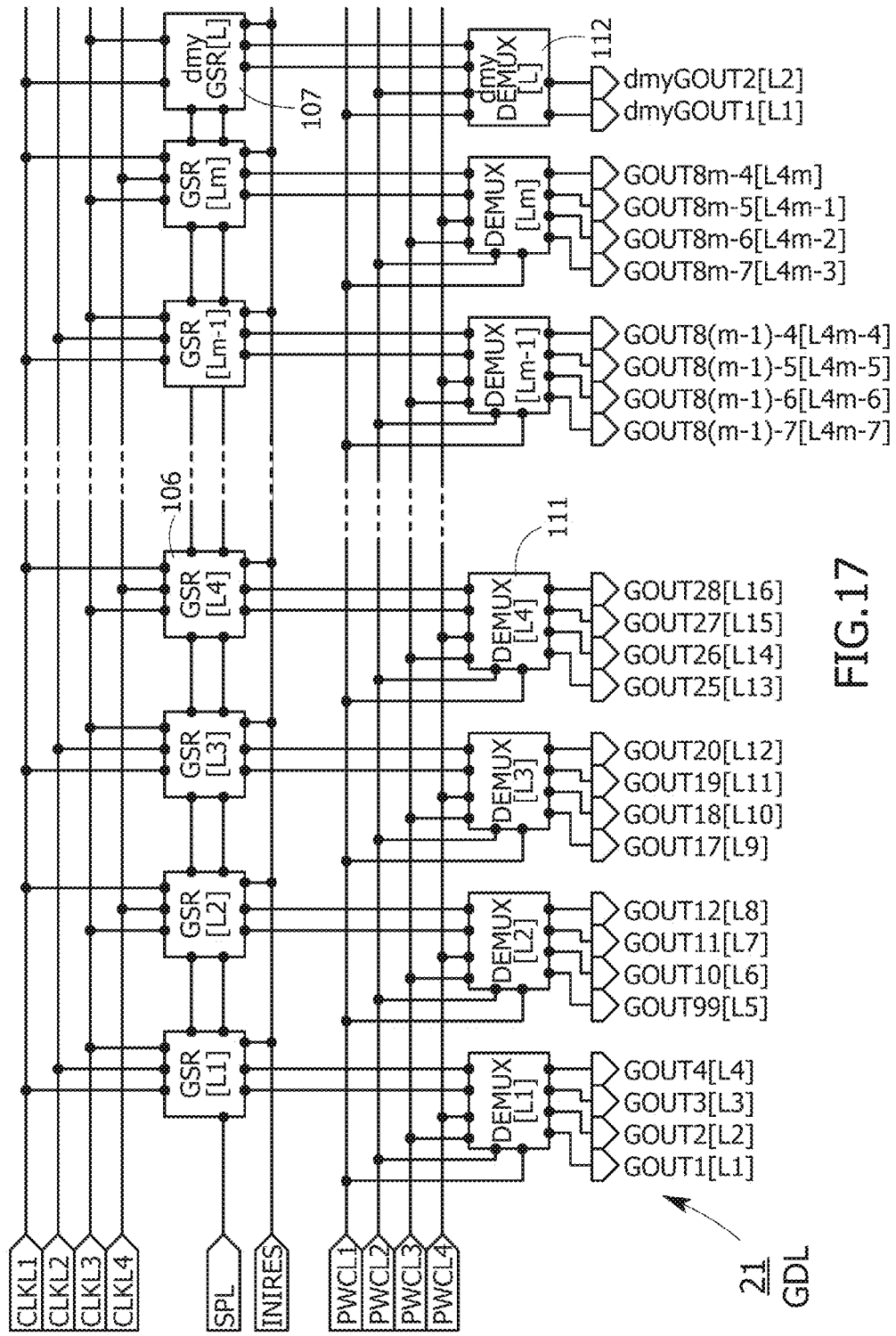
FIG. 17 is a block diagram illustrating a structural example of a gate driver (the left side).
Figure 18:
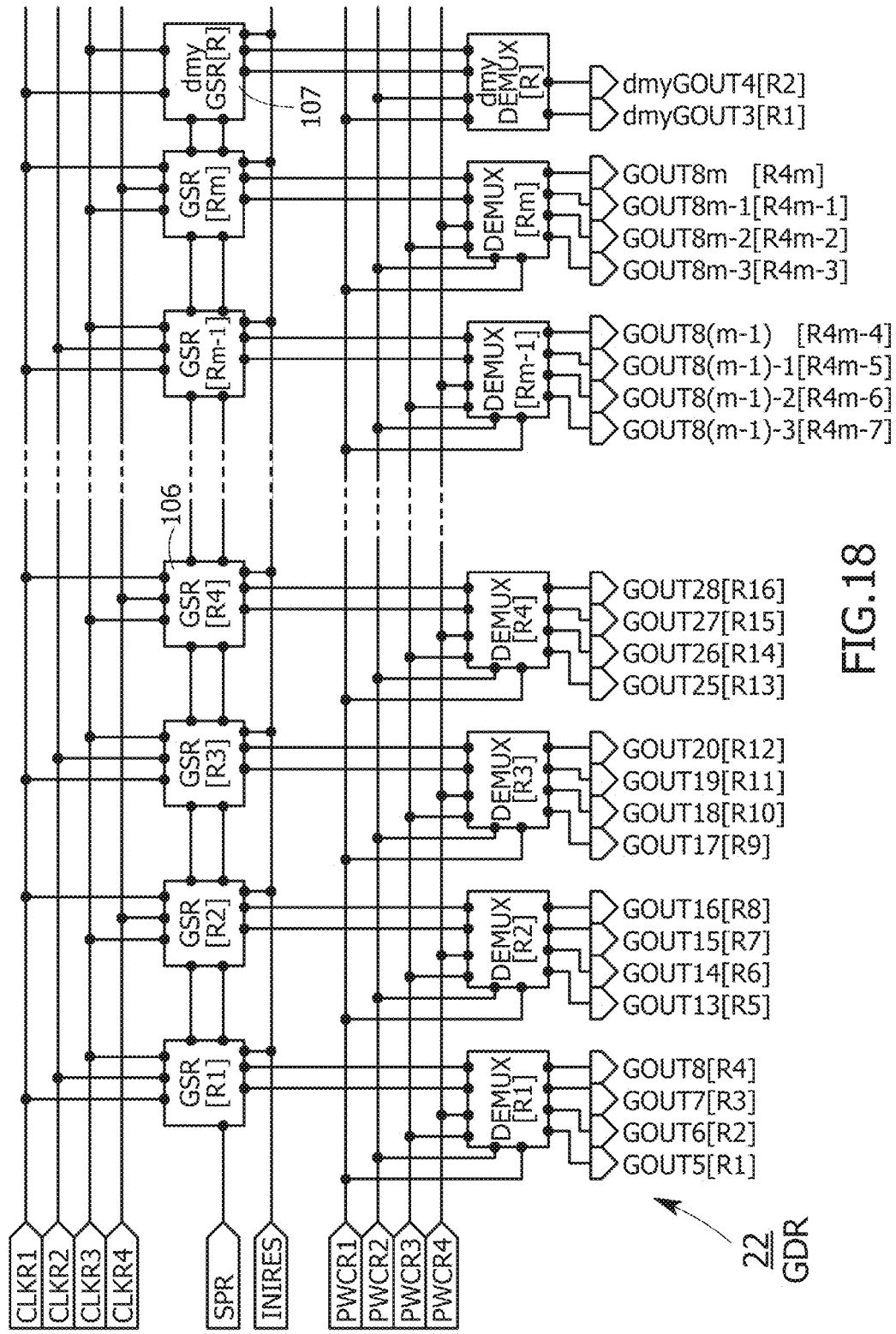
FIG. 18 is a block diagram illustrating a structural example of a gate driver (the right side).

FIG. 17 and FIG. 18 are block diagrams of the gate drivers GDL 21 and GDR 22 each including the GSR 106 and its dummy unit circuit (dmyGSR) 107.

Common reset signal is input from the terminal INIRES to the GSR 106 and the dmyGSR 107 provided in each of the GDL 21 and the GDR 22. By input of reset signal at an H level, the nodes FN2 in all of the unit circuits (GSR) 106 and the dmyGSR 107 are changed to an H level. Accordingly, signals in all of the gate lines 31 are changed to an L level at the same timing and are initialized. Therefore, the signals in all of the gate lines 31 in the pixel portion 20 can be changed to an L level by input of the reset signal from the terminal INIRES even in the middle of a frame period, whereby the operation mode of the LCD 10 can be changed flexibly.

<Structural Examples 2-5 of dmyGSR>

Dummy unit circuits (dmyGSR) corresponding to the GSR 103 to the GSR 106 may be formed in a manner similar to that of the dmyGSR 102 in FIG. 9A. The dmyGSR corresponding to each of the GSR 103 and the GSR 104 is a circuit in which the gate of the transistor M3 is connected to the terminal CK2 with the terminals SROUT(S) and RESIN and the transistors M7 and M8 removed from the respective unit circuits 103 and 104. The dmyGSR corresponding to the GSR 105 and the GSR 106 are circuits in each of which the terminals CK2, SROUT(S), and RESIN and the transistors M3, M7, and M8 are removed from the respective unit circuits 105 and 106.

<Structural Example 2 of BUF>

FIG. 11C illustrates another structural example of the BUF 131. A unit circuit (BUF) 132 in FIG. 11C is a circuit corresponding to the BUF 131 (FIG. 11B) to which a transistor M51 and a capacitor Cp51 are added.

Similar to the transistor M21 in FIG. 13, the transistor M51 is provided to suppress deterioration of the transistor M11. The transistor M51 connects the node FN1 (terminal FNOUT1) and the gate of the transistor M11, and VDD is supplied to a gate of the transistor M51 from a wiring 203. That is, the transistor M51 functions as a switch that is always on. Note that the wiring 203 can also be a wiring used in common with the wiring 201 of the GSR 101 and the like.

The capacitor Cp51 connects the gate of the transistor M11 and the node FNG and functions as a storage capacitor that holds the potential of the gate of the transistor M11. Note that the capacitor Cp51 is not necessarily provided.

Embodiment 3

In this embodiment, the structure of an LC panel (a pixel circuit and drivers) and a manufacturing method thereof will be described. Moreover, in this embodiment, a transistor whose channel is formed using an oxide semiconductor (hereinafter referred to as an OS transistor) is used as a transistor. The OS transistor described in this embodiment is an n-channel transistor.

This embodiment illustrates an example in which the source driver 23 is incorporated in an IC chip as in the LC panel 52 of FIG. 2B, instead of being formed together with the pixel circuits 30.

Figure 19:
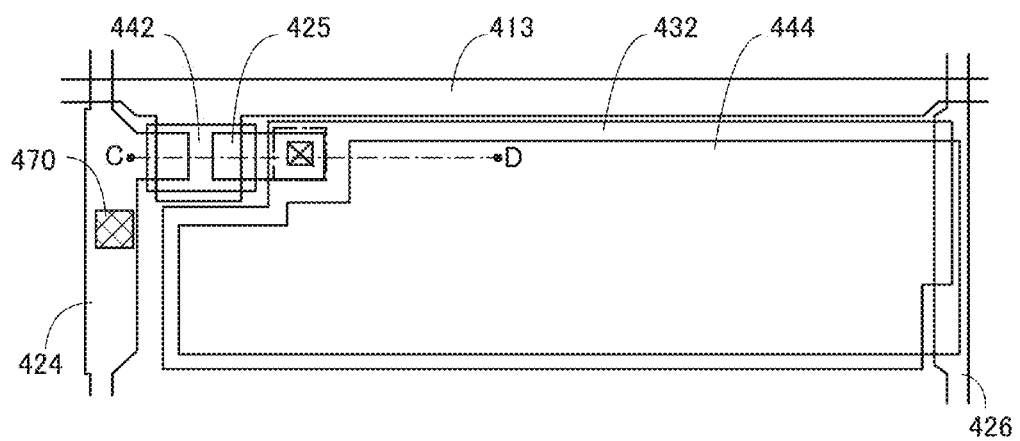
FIG. 19 is a top view illustrating a structural example of a pixel circuit.

FIG. 19 is a top view illustrating a structural example of the pixel circuit 30. In this embodiment, the pixel circuit 30 can be applied to the LCD 10 of a TN mode or a VA mode.

<Structural Example 1 of Driver and Pixel Circuit>

FIG. 20 is a cross-sectional view for describing the cross-sectional structure of the LC panel. FIG. 20 illustrates a cross-sectional structure of the gate drivers 21 and 22 and the pixel circuit 30. Here, a transistor 301 and a connection portion 302 for connecting a wiring in a first layer and a wiring in a second layer are illustrated as a typical example of the gate drivers 21 and 22. Further, FIG. 20 illustrates a cross section taken along line C-D of FIG. 19 as the pixel circuit 30. Note that FIG. 19 illustrates elements of the pixel circuit 30 formed over a substrate 401 (element substrate).

A transistor 303, a capacitor 304, and a liquid crystal element 305 in FIG. 20 correspond to the transistor 34, the capacitor 35, and the liquid crystal element 33 of the pixel circuit 30 in FIG. 2C, respectively.

As illustrated in FIG. 19, a gate line 413, a source line 424, an electrode 425, a wiring 426, a pixel electrode 432, and an electrode 444 are formed in the pixel circuit 30. The wiring 426 corresponds to a wiring 36 in FIG. 2C. The pixel electrode 432 forms one electrode of each of the capacitor 304 and the liquid crystal element 305. The electrode 444 serves as the other electrode of the capacitor 304 and is in contact with the wiring 426. A region where the electrode 444 and the pixel electrode 432 overlap with each other with an insulating film 454 provided therebetween functions as the capacitor 304. Here, the electrode 444 and the pixel electrode 432 are each formed with a light-transmitting conductive film. Therefore, since the capacitor 304 itself has a light-transmitting property, the capacitor 304 having large capacitance value can be formed without a decrease of an aperture ratio of a pixel.

An oxide semiconductor film 442 forms a semiconductor film of the transistor 303 where a channel is formed. A gate electrode of the transistor 303 is formed using the gate line 413. A source electrode and a drain electrode thereof are formed using the source line 424 and the electrode 425, respectively. Note that in the transistor 303, depending on the voltage of the source line 424, in some cases, the source line functions as the drain electrode and the electrode 425 functions as the source electrode. As illustrated in FIG. 20, a gate insulating film of the transistor 303 is formed using an insulating film 451 and an insulating film 452.

In FIG. 19, a rectangular region over the source line 424 illustrates a spacer 470 with which a substrate 402 is provided. More precisely, the rectangular region illustrates a region where the source line 424 and the spacer 470 overlap with each other. The spacer 470 is not necessarily provided in all pixel circuits 30. For example, one spacer 470 may be provided in pixel circuits 30 in two rows and two columns.

As illustrated in FIG. 20, a region where a counter electrode 433 and the pixel electrode 432 overlap with each other with a liquid crystal layer 460 provided therebetween functions as the liquid crystal element 305. The counter electrode 433 is in some cases referred to as a common electrode. The liquid crystal element 305 further includes alignment films 461 and 462 for controlling alignment of the liquid crystal layer 460.

The liquid crystal layer 460 is sealed between the substrate 401 and the substrate 402 by a sealing member (not illustrated, see FIG. 2B). The substrate 402 is provided with a light-blocking film 471, a colored film 472, and an insulating film 473 in addition to the counter electrode 433, the alignment film 462, and the spacer 470. Note that the spacer 470 may be formed over the substrate 401. Moreover, the light-blocking film 471 and/or the colored film 472 may be formed over the substrate 401.

The transistor 301 of each of the gate drivers 21 and 22 has a stacked-layer structure similar to that of the transistor 303 of the pixel circuit 30. The transistor 301 includes an oxide semiconductor film 441 where a channel is formed, a gate line 411, a source line 421, a drain line 422, and a gate insulating film including the insulating films 451 and 452.

The connection portion 302 of each of the gate drivers 21 and 22 is a connection portion of a wiring 412 in a first layer and a wiring 423 in a second layer. The wiring 412 and the wiring 423 are connected to each other through an electrode 431 in a third layer.

The components of the LC panel in FIG. 19 and FIG. 20 are described below.

<Substrate>

There is no particular limitation on the material and the like of the substrate 401 as long as the material and the like have heat resistance enough to withstand manufacturing processes of the pixel circuits 30 and the drivers. For example, a glass substrate, a ceramic substrate, a quartz substrate, or a sapphire substrate can be used. Alternatively, in the case where the pixel electrode 432 is a reflective pixel electrode, a single crystal semiconductor substrate or a polycrystalline semiconductor substrate made of silicon, silicon carbide, or the like, a compound semiconductor substrate made of silicon germanium or the like, an SOI substrate, or the like may be used. For example, in the case where a glass substrate is used as the substrate 401, a large-sized glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized LCD can be manufactured.

Alternatively, a flexible substrate such as a resin film can be used as the substrate 401. In that case, circuits may be formed directly on the flexible substrate. Alternatively, the following steps may be employed: a substrate is used in the manufacturing process of the circuits, and the circuits are separated from the substrate after completion of the manufacturing process and attached to a flexible substrate with an adhesive layer. In that case, a separation layer and an insulating film may be formed over a substrate for manufacture of the circuits, and the pixel circuits and the drivers may be formed on the insulating film.

For the substrate 402, a substrate similar to the substrate 401 can be used.

<Wiring and Electrodes in First Layer>

The wiring 412, and the gate lines 411 and 413 in the first layer are formed using one or two or more conductive films. As the conductive film, a metal film of aluminum, chromium, copper, tantalum, titanium, molybdenum, tungsten, or the like; a film in which another metal element is added to such a metal film; a film including an alloy or a compound containing one kind or plural kinds of the above metal elements; or the like can be used. Alternatively, as the conductive film, a light-transmitting oxide conductive film of indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

As an example of a conductive film having a single-layer structure, there is a single-layer film of an aluminum film containing silicon. In the case of a two-layer structure, for example, the following combinations can be given: an aluminum film and a titanium film; a titanium nitride film and a titanium film; a titanium nitride film and a tungsten film; a tantalum nitride film and a tungsten film; and a tungsten nitride film and a tungsten film. In the case of a three-layer structure, for example, a combination of a titanium film, an aluminum film, and a titanium film can be given. Alternatively, a film, an alloy film, or a nitride film which contains aluminum and one or more elements selected from titanium, tantalum, tungsten, molybdenum, chromium, neodymium, and scandium may be used.

In the transistors 301 and 303, an oxynitride semiconductor film having a nitrogen concentration higher than those of the oxide semiconductor film 441 and the oxide semiconductor film 442 may be formed between the gate lines 411 and 413 and the insulating film 451. As examples of such a film, there are an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, and a film of metal nitride (such as InN or ZnN). These oxynitride semiconductors each have a work function higher than or equal to 5 eV or higher than or equal to 5.5 eV, which is higher than the electron affinity of an oxide semiconductor. With such an oxynitride semiconductor film, the threshold voltages of the transistors 301 and 303 can be shifted to the positive direction. For example, in the case where an In—Ga—Zn-based oxynitride semiconductor film is formed, the nitrogen concentration may be set to 7 atomic % or higher.

<Wirings and Electrodes in Second Layer>

The wirings 423 and 426, the source line 421, the drain line 422, the source line 424, and the electrode 425 in the second layer are formed using one or two or more conductive films. As examples of the conductive film, a metal film of aluminum, titanium, chromium, nickel, copper, yttrium, zirconium, molybdenum, silver, tantalum, tungsten, or the like; an alloy film or a compound film containing one or more kinds of the above metal elements; and a light-transmitting oxide conductive film containing indium oxide, tin oxide, or zinc oxide can be given. In the case of a single-layer structure, for example, an aluminum film containing silicon can be used. In the case of a two-layer structure, for example, the following combinations can be given: an aluminum film and a titanium film; a tungsten film and a titanium film; and a copper-magnesium-aluminum alloy film and a copper film. In the case of a three-layer structure, for example, a combination of a titanium film, an aluminum film, and a titanium film can be given. In that case, a titanium nitride film may be formed in the first layer and/or the third layer. Alternatively, a copper film may be formed in the second layer. In the case of a three-layer structure, alternatively, a combination of a molybdenum film, an aluminum film, and a molybdenum film can be given. In that case, a molybdenum nitride film may be formed in the first layer and/or the third layer, or a copper film may be formed in the second layer.

<Electrodes in Third Layer and Counter Electrode>

The electrode 431 and the pixel electrode 432 in the third layer and the counter electrode 433 are formed using one or two or more light-transmitting conductive films. As an example of the light-transmitting conductive film, a conductive film including indium oxide containing tungsten oxide, indium oxide containing titanium oxide, indium tin oxide (ITO), indium tin oxide containing titanium oxide, indium tin oxide to which silicon oxide is added, indium zinc oxide, or indium zinc oxide containing tungsten oxide can be given.

<Oxide Semiconductor Film and Electrode of Capacitor>

As the oxide semiconductor films 441 and 442 and the electrode 444, one or two or more oxide films of an In—Ga oxide, an In—Zn oxide, an In-M-Zn oxide (M represents Al, Ti, Ga, Y, Zr, La, Ce, Nd, or Hf), or the like are formed. Note that the electrode 444 is formed using a conductive film which is the oxide film for forming the oxide semiconductor films 441 and 442 having low resistance.

For example, in the case where the oxide semiconductor films 441 and 442 are formed using an In-M-Zn oxide, the atomic ratio of In to M in the oxide when summation of In and M is assumed to be 100 atomic % is as follows: the proportion of In is preferably higher than or equal to 25 atomic % and the proportion of M is lower than 75 atomic %, further preferably the proportion of In is higher than or equal to 34 atomic % and the proportion of M is lower than 66 atomic %.

The oxide semiconductor films 441 and 442 can be each formed using an In—Ga—Zn oxide film whose atomic ratio of In to Ga and Zn is 1:1:1 or 3:1:2. Note that in the oxide film, the proportions of atoms in the atomic ratio vary within a range of ±20% as a margin.

The oxide semiconductor films 441 and 442 are each formed using an oxide film whose energy gap is greater than or equal to 2 eV, for example. The energy gap is preferably greater than or equal to 2.5 eV, further preferably greater than or equal to 3 eV. The off-state current of the transistors 301 and 303 can be reduced by using an oxide film having a wide energy gap.

An oxide semiconductor film with low carrier density is used as the oxide semiconductor films 441 and 442. For example, an oxide semiconductor film whose carrier density is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$ is used as the oxide semiconductor films 441 and 442.

When silicon or carbon, which is one of elements belonging to Group 14, is contained in the oxide semiconductor films 441 and 442, the number of oxygen vacancies is increased in the oxide semiconductor films 441 and 442, and the oxide semiconductor films 441 and 442 become n-type films. Thus, the concentrations of silicon and carbon in the oxide semiconductor films 441 and 442 are set to be less than or equal to $2 \times 10^{18}$ atoms/$cm^3$, preferably less than or equal to $2 \times 10^{17}$ atoms/$cm^3$. These concentrations can be measured by secondary ion mass spectrometry (SIMS).

Moreover, the concentration of alkali metals or alkaline earth metals in the oxide semiconductor films 441 and 442 is preferably lower than or equal to $1 \times 10^{18}$ atoms/$cm^3$, further preferably lower than or equal to $2 \times 10^{16}$ atoms/$cm^3$. This is because when an alkali metal or an alkaline earth metal is bonded to an oxide semiconductor, carriers are generated in some cases, which causes an increase in off-state current of the OS transistors.

It is preferable that nitrogen be not contained in the oxide semiconductor films 441 and 442 as much as possible. Nitrogen causes an electron that is a carrier. When the concentration of nitrogen gets higher, the carrier density in the oxide semiconductor film is increased and the oxide semiconductor film easily becomes an n-type film. Therefore, when the concentrations of nitrogen in the oxide semiconductor films 441 and 442 are high, the transistors 301 and 303 tend to have normally-on characteristics. The concentrations of nitrogen in the oxide semiconductor films 441 and 442 are preferably lower than or equal to $5 \times 10^{18}$ atoms/$cm^3$.

The concentrations of impurities (nitrogen, an alkali metal, or the like) in the oxide semiconductor films 441 and 442 can be measured by secondary ion mass spectrometry (SIMS).

The thicknesses of the oxide semiconductor films 441 and 442 and the electrode 444 are greater than or equal to 3 nm and less than or equal to 200 nm, preferably greater than or equal to 3 nm and less than or equal to 100 nm, further preferably greater than or equal to 3 nm and less than or equal to 50 nm.

Both the oxide semiconductor films 441 and 442 and the electrode 444 are formed over the insulating film 452 but differ in impurity concentration. The oxide semiconductor films 441 and 442 each have a lower concentration of impurities than the electrode 444. For example, the concentration of hydrogen in each of the oxide semiconductor films 441 and 442 is lower than $5 \times 10^{19}$ atoms/$cm^3$, preferably lower than $5 \times 10^{18}$ atoms/$cm^3$, further preferably lower than or equal to $1 \times 10^{18}$ atoms/$cm^3$, still further preferably lower than or equal to $5 \times 10^{17}$ atoms/$cm^3$, yet still further preferably lower than or equal to $1 \times 10^{16}$ atoms/$cm^3$. The concentration of hydrogen in the electrode 444 is higher than or equal to $8 \times 10^{19}$ atoms/$cm^3$, preferably higher than or equal to $1 \times 10^{20}$ atoms/$cm^3$, further preferably higher than or equal to $5 \times 10^{20}$ atoms/$cm^3$. The concentration of hydrogen in the oxide film for forming the electrode 444 is 2 times or more, preferably 10 times or more those of hydrogen in the oxide semiconductor films 441 and 442. By improving the concentration of hydrogen in such a manner, the resistivity of the oxide film can be reduced sufficiently.

That is, the resistivity of the electrode 444 is lower than those of the oxide semiconductor films 441 and 442. The resistivity of the electrode 444 is set to $\frac{1}{10}$ times those of the oxide semiconductor films 441 and 442. The resistivity of the electrode 444 is preferably reduced to approximately $1 \times 10^{-8}$ times those of the oxide semiconductor films 441 and 442. The resistivity of the electrode 444 is typically greater than or equal to $1 \times 10^{-3}$ Ωcm and less than $1 \times 10^4$ Ωcm, preferably greater than or equal to $1 \times 10^{-3}$ Ωcm and less than $1 \times 10^{-1}$ Ωcm.

Note that the oxide semiconductor film for forming the oxide semiconductor films 441 and 442 are not limited to that described in this embodiment. A film having an appropriate composition may be selected depending on semiconductor characteristics and electrical characteristics (e.g., field-effect mobility and threshold voltage) of the OS transistors. Further, in order to obtain needed semiconductor characteristics of the OS transistors, for example, the carrier density, the impurity concentration, the defect density, the atomic ratio of a metal element to oxygen, the interatomic distance, the density, and the like of the oxide semiconductor films 441 and 442 are preferably set to be appropriate.

When an oxide semiconductor film in which the impurity concentration is low and density of defect states is low is used for the oxide semiconductor films 441 and 442, the transistors 301 and 303 can have excellent electrical characteristics.

A crystal structure of an oxide semiconductor film for forming the oxide semiconductor films 441 and 442 is described below.

In this specification, a term "parallel" indicates that the angle formed between two straight lines is greater than or equal to −10° and less than or equal to 100, and accordingly also includes the case where the angle is greater than or equal to −5° and less than or equal to 5°. In addition, a term "perpendicular" indicates that the angle formed between two straight lines is greater than or equal to 800 and less than or equal to 1000, and accordingly includes the case where the angle is greater than or equal to 85° and less than or equal to 950.

In this specification, the trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle ($2\theta$) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around 56°. This peak is derived from the (110) plane of the InGaZnO$_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appears at around 31° and a peak of $2\theta$ do not appear at around 36°.

In a transistor using the CAAC-OS film, change in electrical characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

The film of the electrode 444 has the same crystallinity as the oxide semiconductor films 441 and 442.

<Insulating Film>

The insulating film 451 is preferably formed using a nitride insulating film of silicon nitride, silicon nitride oxide, aluminum nitride, or aluminum nitride oxide, for example.

As the insulating film 452, a film capable of improving characteristics of an interface with the oxide semiconductor films 441 and 442 is preferably formed. The insulating film 452 can be formed to have a single-layer structure or a stacked-layer structure using, for example, a silicon oxide film, a silicon oxynitride film, a silicon nitride oxide film, a silicon nitride film, an aluminum oxide film, a gallium oxide film, a Ga—Zn-based metal oxide film, or a film including a high-k material such as hafnium oxide. The use of the film including a high-k material enables a reduction in gate leakage current in the transistors 301 and 303. As a high-k material, there is hafnium silicate (HfSi$_x$O$_y$), hafnium silicate to which nitrogen is added, hafnium aluminate (HfAl$_x$O$_y$), hafnium aluminate to which nitrogen is added, yttrium oxide, or the like.

The total thickness of the insulating films 451 and 452 is greater than or equal to 5 nm and less than or equal to 400 nm, preferably greater than or equal to 10 nm and less than or equal to 300 nm, further preferably greater than or equal to 50 nm and less than or equal to 250 nm.

For the insulating film 453, in a manner similar to that of the insulating film 452, a material capable of improving characteristics of the interface with the oxide semiconductor films 441 and 442 is preferably used. The insulating film 453 can be formed using an oxide insulating film, for example. Here, the insulating film 453 is formed to have a stacked-layer structure of an insulating film 453a and an insulating film 453b. The insulating film 453a functions as a film that relieves damage to the oxide semiconductor films 441 and 442 and the electrode 444 at the time of forming the insulating film 453b.

It is preferable that the insulating film 453a be formed using an insulating film which transmits oxygen. When the insulating film which transmits oxygen is formed as the insulating film 453a, oxygen released from the insulating film 453b can be transferred to the oxide semiconductor films 441 and 442 through the insulating film 453a, so that oxygen vacancies in the oxide semiconductor films 441 and 442 can be reduced. Note that all oxygen atoms entering the insulating film 453a from the outside are not moved to the outside of the insulating film 453a and some oxygen atoms remains in the insulating film 453a in some cases. Further, transfer of oxygen occurs in the insulating film 453a in some cases in such a manner that oxygen enters the insulating film 453a and oxygen contained in the insulating film 453a is moved to the outside of the insulating film 453a.

As the insulating film 453a, a silicon oxide film, a silicon oxynitride film, or the like having a thickness greater than or equal to 5 nm and less than or equal to 150 nm, preferably greater than or equal to 5 nm and less than or equal to 50 nm can be used. In this specification, oxynitride refers to a substance which includes more oxygen than nitrogen, and nitride oxide refers to a substance which includes more nitrogen than oxygen.

The insulating film 453b is formed using an insulating film including oxide or oxynitride. The oxide or oxynitride for forming the insulating film 453b preferably contains oxygen at a higher proportion than that in the stoichiometric composition. With such a composition, the insulating film 453b is in a state that some oxygen atoms are likely to be released therefrom when heated. The insulating film containing oxygen at a higher proportion than that in the stoichiometric composition is a film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis.

As the insulating film 453b, a silicon oxide film, a silicon oxynitride film, or the like having a thickness greater than or equal to 30 nm and less than or equal to 500 nm, preferably greater than or equal to 50 nm and less than or equal to 400 nm can be used.

Further, it is preferable that the amount of defects at the interface between the insulating film 453a and the oxide semiconductor films 441 and 442 be small. In order to achieve that, it is preferable that the electron spin density of a signal which appears at g=1.93 due to the defects in the oxide semiconductor films 441 and 442 be lower than or equal to $1 \times 10^{17}$ spins/cm$^3$, further preferably lower than or equal to the lower limit of detection. Note that a g factor of the electron spin and density thereof can be calculated from an electron spin resonance (ESR) spectrum. The same applies to the description below.

Further, it is preferable that the insulating films 453a and 453b have few defects. This is because if the density of defects in the insulating films 453a and 453b is high, oxygen is bonded to the defects and the amount of oxygen that is transmitted through the insulating film 453a is decreased. Different from the insulating film 453a, the insulating film 453b does not have an interface with the oxide semiconductor films 441 and 442 and the electrode 444; thus, the insulating film 453b may have higher defect density than the insulating film 453a. The electron spin density of the insulating film 453a of a signal which appears at g=2.001 is preferably lower than or equal to $3 \times 10^{17}$ spins/cm$^3$, and that of the insulating film 453b is preferably lower than $1.5 \times 10^{18}$ spins/cm$^3$, further preferably lower than or equal to $1 \times 10^{18}$ spins/cm$^3$. The electron spins of the signal which appears at g=2.001 are due to a dangling bond of silicon.

It is preferable to form the insulating film 454 using a film having a blocking effect against impurities such as oxygen, hydrogen, water, an alkali metal, and an alkaline earth metal. As such an insulating film, there are a nitride insulating film and a nitride oxide insulating film, specifically a film including silicon nitride, silicon nitride oxide, aluminum nitride, aluminum nitride oxide, or the like. When the insulating film 454 having the blocking effect is formed, oxygen can be prevented from diffusing from the oxide semiconductor films 441 and 442 and the electrode 444 to the outside.

The insulating film 454 can be a stacked film in which an oxide insulating film or an oxynitride insulating film having a blocking effect against impurities such as oxygen, hydrogen, and water is formed over the nitride insulating film having the blocking effect. As the oxide insulating film having such a blocking effect, there is an insulating film including aluminum oxide, aluminum oxynitride, gallium oxide, gallium oxynitride, yttrium oxide, yttrium oxynitride, hafnium oxide, or hafnium oxynitride.

In order to adjust the capacitance value of the capacitor 304, an insulating film including nitride, nitride oxide, or oxide may be provided over the nitride insulating film having the blocking effect as the insulating film 454.

<Alignment Film>

An alignment film 461 can be formed using an organic resin such as polyimide. The thickness of the alignment film 461 is preferably greater than or equal to 40 nm and less than or equal to 100 nm, further preferably greater than or equal to 50 nm and less than or equal to 90 nm. With such a thickness, the pretilt angles of the liquid crystal material of the liquid crystal layer 460 can be made large, which can reduce disclination.

<Color Filter and Black Matrix>

The colored film 472 having a colored property is formed on the substrate 402. The colored film 472 functions as a color filter. The colored film 472 is not necessarily provided in the case where the LCD 10 is a monochrome display device or a field-sequential method is employed as the display method, for example.

The colored film 472 is a colored film that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used.

Further, the light-blocking film 471 adjacent to the colored film 472 is formed on the substrate 402. The light-blocking film 471 functions as a black matrix. Here, the gate driver is covered with the light-blocking film 471. The light-blocking film 471 preferably has a function of blocking light in a specific wavelength region, and can be formed using a metal film, an organic insulating film including a black pigment, or the like.

<Manufacturing Method Example>

An example of a method for manufacturing the LC panel illustrated in FIG. 20 is described below.

<Manufacture of Element Substrate>

First, a method for manufacturing the element substrate which serves as a backplane of the LC panel is described with reference to FIGS. 21A to 21C, FIGS. 22A to 22C, FIGS. 23A to 23C, and FIGS. 24A to 24C.

Here, a glass substrate is used as the substrate 401. In order to form the wiring 412 and the gate lines 411 and 413 in the first layer, a conductive film having a single-layer structure or a stacked-layer structure of two or more layers is formed over the substrate 401. Examples of a formation method of the conductive film include a CVD method, a sputtering method, and a spin coating method. The gate line 411, the wiring 412, and the gate line 413 are formed from the conductive film through a photolithography process and an etching step (FIG. 21A).

Next, the insulating film 451 is formed over the wiring 412 and the gate lines 411 and 413 in the first layer, and the insulating film 452 is formed over the insulating film 451 (FIG. 21A). The insulating films 451 and 452 can be formed by a sputtering method, a CVD method, or the like. Note that it is preferable that the insulating films 451 and 452 be formed in succession without exposure to the air, in which case entry of impurities is suppressed.

Next, an oxide semiconductor film 440 is formed over the insulating film 452 (FIG. 21B).

The oxide semiconductor film 440 can be formed by a sputtering method, a coating method, a pulsed laser deposition method, a laser ablation method, or the like.

The oxide semiconductor film 440 is processed into island-shaped oxide semiconductor films 441 to 443 by a photolithography process and an etching step. In the etching step, either or both of dry etching and wet etching may be performed (FIG. 21C).

After that, hydrogen, water, and the like may be released from the oxide semiconductor films 441 to 443 by heat treatment and hydrogen and water in the oxide semiconductor films 441 to 443 may be reduced. Through such heat treatment, the oxide semiconductor films 441 to 443 can be highly purified. The heat treatment is performed typically at a temperature higher than or equal to 250° C. and lower than or equal to 650° C., preferably higher than or equal to 300° C. and lower than or equal to 500° C. Note that in the case where a large-sized substrate is used as the substrate 401, the heat treatment is performed typically at a temperature higher than or equal to 300° C. and lower than or equal to 400° C., preferably higher than or equal to 320° C. and lower than or equal to 370° C. In such a temperature range, a warp or shrink of the substrate can be reduced and a decrease in yield can be suppressed.

An electric furnace, an RTA apparatus, or the like can be used for the heat treatment. With the use of the RTA apparatus, only in a short time, the heat treatment can be performed at a temperature higher than or equal to the strain point of the substrate 401. Thus, cycle time of the heat treatment can be shortened, which is particularly preferable in a large-sized substrate.

The heat treatment may be performed under an atmosphere of nitrogen, oxygen, ultra-dry air (air in which a water content is 20 ppm or less, preferably 1 ppm or less, further preferably 10 ppb or less), or a rare gas (argon, helium, or the like). It is preferable that the above atmosphere do not contain hydrogen, water, or the like. The atmosphere can be changed. For example, heat treatment can be first performed in a nitrogen atmosphere or a rare gas atmosphere and then heat treatment can be additionally performed in an oxygen atmosphere or an ultra-dry air atmosphere. In that case, hydrogen, water, and the like can be released from the oxide semiconductor films 441 to 443 through the first heat treatment and oxygen can be supplied to the oxide semiconductor films 441 to 443 through the second heat treatment. Thus, oxygen vacancies in the oxide semiconductor films 441 to 443 can be reduced.

Next, a conductive film 420 is formed over the insulating film 452 and the oxide semiconductor films 441 to 443 by a sputtering method or the like (FIG. 22A).

Next, the source line 421, the drain line 422, the wiring 423, the source line 424, the electrode 425, and the wiring 426 are formed from the conductive film 420 through a photolithography process and an etching step (FIG. 22B). The wiring 423 and the wiring 412 are formed so as to overlap with each other, so that areas occupied by the wiring 423 and the electrode 431 for connecting the wiring 423 to the wiring 412 can be made small.

Next, the insulating film 453 is formed so as to cover the insulating film 452, the oxide semiconductor films 441 to 443, and the wirings 423 and 426, the source line 421, the drain line 422, the source line 424, and the electrode 425 in the second layer (FIG. 22C).

Here, for the formation of the insulating film 453, the insulating film 453a is formed, and then the insulating film 453b is formed in succession without exposure to the air. After the formation of the insulating film 453a, the insulating film 453b is formed in succession by adjusting at least one of the flow rate of the source gas, the pressure, the high-frequency power, and the substrate temperature without exposure to the air, whereby the concentration of impurities attributed to the air at the interface between the insulating film 453a and the insulating film 453b can be reduced.

As the insulating film 453a, a silicon oxide film or a silicon oxynitride film can be formed under the following conditions: the substrate placed in a treatment chamber of a plasma CVD apparatus, which is vacuum-evacuated, is held at a temperature higher than or equal to 180° C. and lower than or equal to 400° C., preferably higher than or equal to 200° C. and lower than or equal to 370° C., the pressure of the treatment chamber to which a source gas is introduced is greater than or equal to 20 Pa and less than or equal to 250 Pa, preferably greater than or equal to 100 Pa and less than or equal to 250 Pa, and a high-frequency power is supplied to an electrode provided in the treatment chamber.

The bonding strength of silicon and oxygen in the silicon oxide film or the silicon oxynitride film becomes strong in the above temperature range. Thus, a silicon oxide film and a silicon oxynitride film which are dense and hard and which transmit oxygen can be formed. Typically, a silicon oxide film or a silicon oxynitride film of which etching using hydrofluoric acid of 0.5 wt % at 25° C. is performed at a rate of lower than or equal to 10 nm/min, preferably lower than or equal to 8 nm/min can be formed.

As a source gas of the silicon oxide film or the silicon oxynitride film, a deposition gas containing silicon and an oxidizing gas are preferably used. Typical examples of the deposition gas containing silicon include silane, disilane, trisilane, and silane fluoride. As the oxidizing gas, oxygen, ozone, dinitrogen monoxide, and nitrogen dioxide can be given as examples.

It is preferable to reduce the concentration of hydrogen in the insulating film 453a in order to reduce the concentrations of hydrogen in the oxide semiconductor films 441 and 442. For example, in the case of using a silicon oxide film or a silicon oxynitride film as the insulating film 453a, the amount of the oxidizing gas is 100 or more times the amount of a deposition gas containing silicon.

With the use of the above conditions, an oxide insulating film which transmits oxygen can be formed as the insulating film 453a. Further, with the insulating film 453a, damage to the oxide semiconductor films 441 to 443 can be reduced in a step of forming the insulating film 453b which is formed later.

The oxide semiconductor films 441 to 443 are heated by the formation of the insulating film 453a in the above substrate temperature range, so that hydrogen, water, or the like can be released from these films.

Further, time for heating in a state where the oxide semiconductor films 441 to 443 are exposed can be shortened because heating is performed in a step of forming the insulating film 453a. Thus, the amount of oxygen released from the oxide semiconductor films 441 to 443 by heat treatment can be reduced. Accordingly, an increase of oxygen vacancies in the oxide semiconductor films 441 to 443 is suppressed.

Note that by setting the pressure in the treatment chamber to be greater than or equal to 100 Pa and less than or equal to 250 Pa, the amount of water contained in the insulating film 453a is reduced; thus, fluctuations in electrical characteristics of the transistors 301 and 303 can be reduced and changes in threshold voltage can be suppressed. Moreover, damage to the oxide semiconductor films 441 to 443 at the time of forming the insulating film 453a can be reduced.

Note that when the ratio of the amount of the oxidizing gas to the amount of the deposition gas containing silicon is 100 or higher, the hydrogen content of the insulating film 453a can be reduced. Consequently, the amount of hydrogen entering the oxide semiconductor films 441 to 443 can be reduced; thus, the negative shift in the threshold voltage of the transistor can be suppressed.

Here, as the insulating film 453b, a silicon oxide film or a silicon oxynitride film is formed with a plasma CVD apparatus. As the film formation conditions, the substrate temperature is higher than or equal to 180° C. and lower than or equal to 280° C., preferably higher than or equal to 200° C. and lower than or equal to 240° C. The pressure of the treatment chamber to which a source gas is introduced is preferably greater than or equal to 100 Pa and less than or equal to 250 Pa, further preferably greater than or equal to 100 Pa and less than or equal to 200 Pa. A high-frequency power is higher than or equal to 0.17 W/cm$^2$ and lower than or equal to 0.5 W/cm$^2$, preferably higher than or equal to 0.25 W/cm$^2$ and lower than or equal to 0.35 W/cm$^2$.

As a source gas of the silicon oxide film or the silicon oxynitride film, a deposition gas containing silicon and an oxidizing gas may be used. Typical examples of the deposition gas containing silicon include silane, disilane, trisilane, and silane fluoride. As the oxidizing gas, oxygen, ozone, dinitrogen monoxide, and nitrogen dioxide can be given as examples.

The flow rate of the deposition gas containing silicon relative to the oxidizing gas can be increased, whereby the amount of defects in the insulating film 453b can be reduced. The electron spin density of the insulating film 453b is preferably lower than 6×10$^{17}$ spins/cm$^3$, preferably lower than or equal to 3×10$^{17}$ spins/cm$^3$, further preferably lower than or equal to 1.5×10$^{17}$ spins/cm$^3$.

The high-frequency power having such a high power density as described above is supplied, whereby the decomposition efficiency of the source gas in plasma is increased, oxygen radicals are increased, and oxidation of the source gas proceeds; therefore, the oxygen content of the silicon oxide film or the silicon oxynitride film can be made higher than that in the stoichiometric composition. When the substrate temperature is in the above temperature range, the bonding strength of silicon and oxygen is weak; therefore, part of oxygen is likely to be released by heating. Thus, it is possible to form a silicon oxide film or a silicon oxynitride film which contains oxygen at a higher proportion than that in the stoichiometric composition and from which part of oxygen is released by heating. Such a silicon oxide film or a silicon oxynitride film may be formed as the insulating film 453b.

The oxide semiconductor films 441 to 443 are protected by the insulating film 453a even when the insulating film 453b is formed by high-frequency power having a high power density; therefore, the insulating film 453b which is effective in improving characteristics of the OS transistors can be formed while damage to the oxide semiconductor films 441 to 443 is suppressed.

Next, heat treatment is performed. The heating temperature is typically higher than or equal to 150° C. and lower than the strain point of the substrate, preferably higher than or equal to 200° C. and lower than or equal to 450° C., further preferably higher than or equal to 300° C. and lower than or equal to 450° C. Note that in the case where a large-sized substrate is used as the substrate 401, the heat treatment is performed typically at a temperature higher than or equal to 300° C. and lower than or equal to 400° C., preferably higher than or equal to 320° C. and lower than or equal to 370° C. In such a temperature range, a warp or shrink of the large-sized substrate can be reduced.

An electric furnace, an RTA apparatus, or the like can be used for the heat treatment. With the use of the RTA apparatus, only in a short time, the heat treatment can be performed at a temperature higher than or equal to the strain point of the substrate 401. Therefore, the heat treatment time can be shortened.

The heat treatment may be performed under an atmosphere of nitrogen, oxygen, ultra-dry air (air in which a water content is 20 ppm or less, preferably 1 ppm or less, further preferably 10 ppb or less), or a rare gas (argon, helium, or the like). Impurities for the oxide semiconductor films 441 to 443, such as hydrogen and water, are prevented as much as possible from entering the atmosphere.

By the heat treatment, part of oxygen contained in the insulating film 453b is transferred to the oxide semiconductor films 441 to 443, so that the oxygen vacancies in the oxide semiconductor films 441 to 443 can be reduced.

Although, in some cases, the oxide semiconductor films 441 and 442 are damaged by etching of the conductive film 420 at the formation of the wirings 423 and 426, the source line 421, the drain line 422, the source line 424, and the electrode 425 in the second layer and oxygen vacancies are generated on the back channel sides of the transistors 301 and 303, the oxygen vacancies can be repaired by the heat treatment. Therefore, reliability of the transistors 301 and 303 can be improved.

It is preferable to perform the heat treatment before the formation of the insulating film 454. This is because since the insulating film 454 is formed as a blocking film against water, hydrogen, and the like, when the heat treatment is performed with the insulating film 454, water, hydrogen, and the like which are contained in the insulating film 453 cannot be released to the atmosphere, and thus they are transferred to the oxide semiconductor films 441 to 443.

In the case where the insulating film 453b is formed while being heated, the heat treatment is not necessarily performed as long as the oxygen vacancies of the oxide semiconductor films 441 to 443 are reduced by the formation of the insulating film 453b. Alternatively, the heat treatment may be performed after formation of an opening 491 and an opening 492 in the insulating film 453.

Next, the openings 491 and 492 are formed in the insulating film 453 by a photolithography process and an etching step (FIG. 23A). The opening 491 is formed in the connection portion 302 to expose the surface of the wiring 423. The opening 492 is formed in the capacitor 304 to expose the surface of the oxide semiconductor film 443.

Next, the insulating film 454 is formed over the insulating films 452 and 453 and the oxide semiconductor film 443 (FIG. 23B).

The insulating film 454 may be formed using a material which can prevent diffusion of impurities from the outside, for example, oxygen, hydrogen, water, an alkali metal, and an alkaline earth metal into the oxide semiconductor film. In addition, the insulating film 454 preferably contains hydrogen. Hydrogen is contained in the insulating film 454 to reduce the resistance of the oxide semiconductor film 443 by supply of hydrogen thereto. When the insulating film 454 contains hydrogen and the hydrogen diffuses into the oxide semiconductor film 443, hydrogen is bonded to oxygen in the oxide semiconductor film 443, thereby generating an electron serving as a carrier. Thus, the oxide semiconductor film 443 has higher conductivity, thereby serving as the electrode 444 formed with a conductive film.

For example, a silicon nitride film or a silicon nitride oxide film may be formed by a plasma CVD method as the insulating film 454. The substrate temperature at the deposition of the insulating film 454 is set at a range within which a phenomenon in which carrier concentrations of the oxide semiconductor films 441 and 442 are increased by release of oxygen therefrom is not caused.

Next, an opening 493 and an opening 494 are formed in the insulating films 451, 452, and 454 by a photolithography process and an etching step (FIG. 23C). The surfaces of the wirings 412 and 423 are exposed by the formation of the opening 493 in the connection portion 302. Moreover, the opening 494 is formed in the transistor 303 to connect the electrode 425 and the pixel electrode 432.

A conductive film 430 is formed over the insulating film 454 by a sputtering method or the like (FIG. 24A). The electrode 431 and the pixel electrode 432 are formed from the conductive film 430 by a photolithography process and an etching step (FIG. 24B).

Circuits (pixel circuits and gate drivers) are formed over the substrate 401 through the above process. In the process, the terminal portion is also formed over the substrate 401. Further, the alignment film 461 is formed as needed over the substrate 401 in a sealing process (FIG. 24C).

In the method for manufacturing the element substrate of this embodiment, in the gate driver, the electrode 431 in the third layer (in the same layer as the pixel electrode) connects the wiring in the first layer and the wiring in the second layer. Therefore, it is not necessary to form the opening for connecting the wiring in the first layer and the wiring in the second layer in the insulating films 451 and 452; thus, the number of light-exposure masks can be reduced by one. Therefore, in this embodiment, the element substrate can be formed with six sheets of light-exposure masks.

<Manufacture Of Counter Substrate>

An example of a manufacturing process of the counter substrate of the LC panel is described with reference to FIGS. 25A to 25C. The counter substrate is also referred to as a color filter substrate and the like.

The light-blocking film 471 and the colored film 472 are formed over the substrate 402 (see FIG. 25A). The insulating film 473 is formed over the light-blocking film 471 and the colored film 472 (see FIG. 25B).

As the insulating film 473, an organic insulating film of an acrylic resin, an epoxy resin, polyimide, or the like can be used, for example. The insulating film 473 is formed as an overcoat of the color filter and the black matrix. The insulating film 473 may be formed as needed.

Next, the counter electrode 433 is formed over the insulating film 473. The counter electrode 433 is formed using a light-transmitting conductive film formed by a sputtering method or the like. A spacer 470 is formed over the counter electrode 433. The spacer 470 can be formed in such a manner that the counter electrode 433 is coated with a photosensitive resin and subjected to developing treatment. Through the above process, the counter substrate is formed. In the sealing process described later, the counter substrate is provided with the alignment film.

<Sealing Process>

A process of sealing the liquid crystal layer 460 between the element substrate and the counter substrate to manufacture the LC panel is described.

The alignment film 461 is formed over the element substrate (substrate 401). After the element substrate is cleaned, a surface of the element substrate is coated with a polyimide resin by a printing method or the like and then baked to form the alignment film 461. Alignment treatment is performed on the alignment film 461 through rubbing or irradiation with light. The counter substrate is provided with the alignment film 462 in a similar manner.

Next, the counter substrate is coated with a sealant to seal the liquid crystal layer 460. Here, an ultraviolet curable sealant for a one drop filling (ODF) method is used. Next, the liquid crystal material is dropped in a region of the counter substrate surrounded by the sealant. This step is performed in a nitrogen atmosphere. Then, the element substrate and the counter substrate are attached to each other. Then, irradiation with ultraviolet rays is performed to cure the sealant, so that the sealing member is completed.

Through the above sealing process, the LC panel in which the liquid crystal layer 460 is sealed between the element substrate and the counter substrate is manufactured. A member such as an FPC, which is needed, may be further attached to the LC panel.

This embodiment can be combined as appropriate with the other embodiment in this specification.

Embodiment 4

In this embodiment, another structural example of the pixel circuit 30 is described. Specifically, another structural example of the transistor and other structural examples of the capacitor are described.

<Structural Example 2 of Pixel Circuit>

Figure 26A:
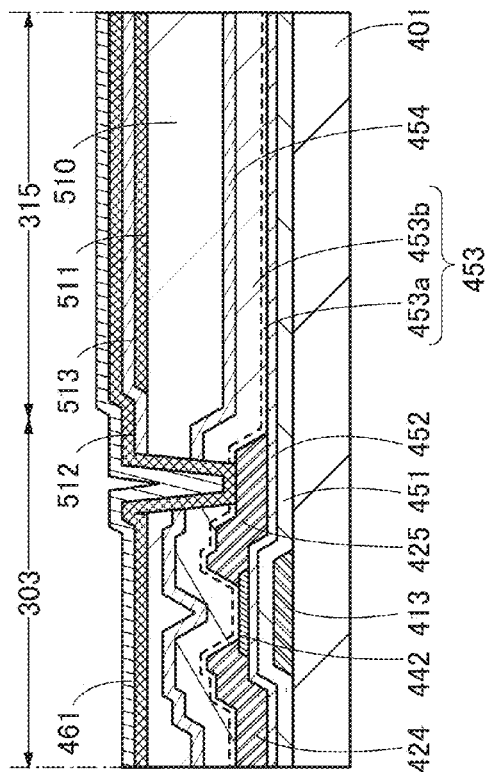
FIGS. 26A to 26C are cross-sectional views each illustrating a structural example of a pixel circuit.

FIG. 26A illustrates another structural example of the transistor. In a transistor 313, the insulating film 453 functioning as a channel protective film is provided over the oxide semiconductor film 442. Therefore, the insulating film 453 is formed before the formation of the conductive film 420. A portion of the insulating film 453 other than the portion functioning as the channel protective film is removed by etching. After the etching step, the conductive film 420 is formed.

Since the insulating film 453 is provided over the oxide semiconductor film 442, the oxide semiconductor film 442 can be prevented from being damaged in the etching step of the conductive film 420. Therefore, the insulating film 453 is called as an etching stop film. A gate insulating film of the transistor 313 is a stack film of the insulating film 451 and the insulating film 452 in a manner similar to that of the gate insulating film of the transistor 303; however, in the transistor 313, the insulating film 452 exists only in a region overlapping with the oxide semiconductor film 442 and the electrode 444 by the formation of the channel protective film.

The transistor of each of the gate drivers 21 and 22 is formed in a manner similar to that of the transistor 313.

<Structural Example 3 Of Pixel Circuit>

Figure 26B:
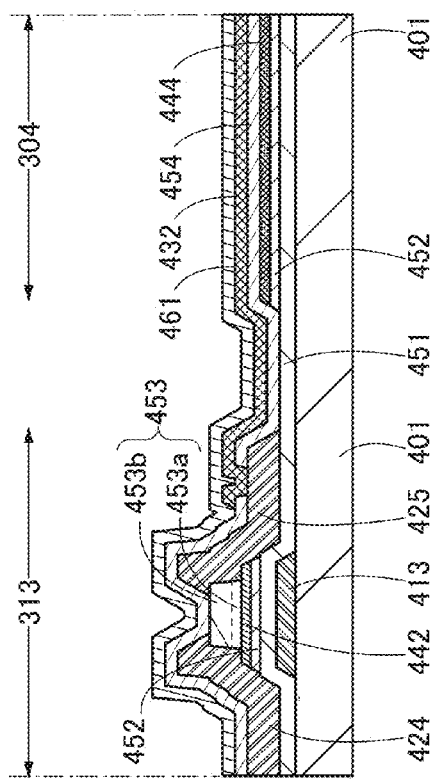

FIG. 26B illustrates another structural example of the capacitor. A capacitor 314 includes the pixel electrode 432, an electrode 501, and the insulating film 454. The electrode 501 is formed using a conductive film similar to that used for the pixel electrode 432, which has a light-transmitting property. Note that in FIG. 26B, the transistor 313 of FIG. 26A can be used.

<Structural Example 4 of Pixel Circuit>

Figure 26C:
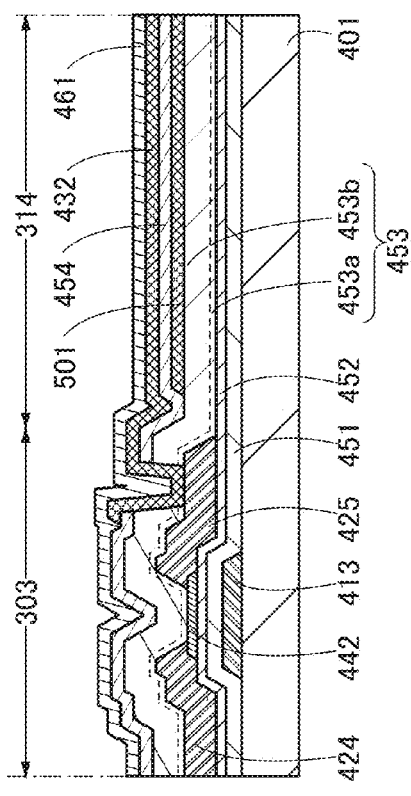

FIG. 26C illustrates another structural example of the capacitor. As illustrated in FIG. 26C, an insulating film 510 is formed so as to cover the transistor 303. The insulating film 510 is formed as a planarization film. An electrode 511, an insulating film 513, and a pixel electrode 512 are formed over the insulating film 510. A capacitor 315 includes the electrode 511, the pixel electrode 512, and the insulating film 513.

The electrode 511 and the pixel electrode 512 can be formed in manners similar to that of the pixel electrode 432. The insulating film 513 can be formed in a manner similar to that of the insulating film 454.

For the insulating film 510, a resin film of acrylic, polyimide, epoxy, or the like can be used. The thickness of the insulating film 510 is preferably greater than or equal to the thickness of the insulating film 453 and less than or equal to 1500 nm, further preferably greater than or equal to the thickness of the insulating film 453 and less than or equal to 1000 nm. The thickness of the insulating film 510 is greater than or equal to the thickness of the insulating film 453, so that a depressed portion of the pixel electrode 512 can be filled with the insulating film 510 and unevenness of a region where the alignment film 461 is formed can be reduced. As the insulating film 510 gets thicker, voltage for controlling the alignment of the liquid crystal layer 460, which is applied to the pixel electrode 432, becomes higher and power consumption of the LCD 10 becomes higher. Therefore, it is preferable that the thickness of the insulating film 510 be less than or equal to 1500 nm.

This embodiment can be combined as appropriate with the other embodiment in this specification.

Embodiment 5

The display device of one embodiment of the present invention can be applied to a display portion of any of a variety of electronic devices (including game machines). Examples of electronic devices include television sets (also referred to as televisions or television receivers), monitors of computers, cameras such as digital cameras or digital video cameras, digital photo frames, mobile phones, portable game consoles, portable information terminals, audio reproducing devices, and game machines (e.g., pachinko machines or slot machines). Examples of such electronic devices are illustrated in FIGS. 27A to 27C.

Figure 27A:
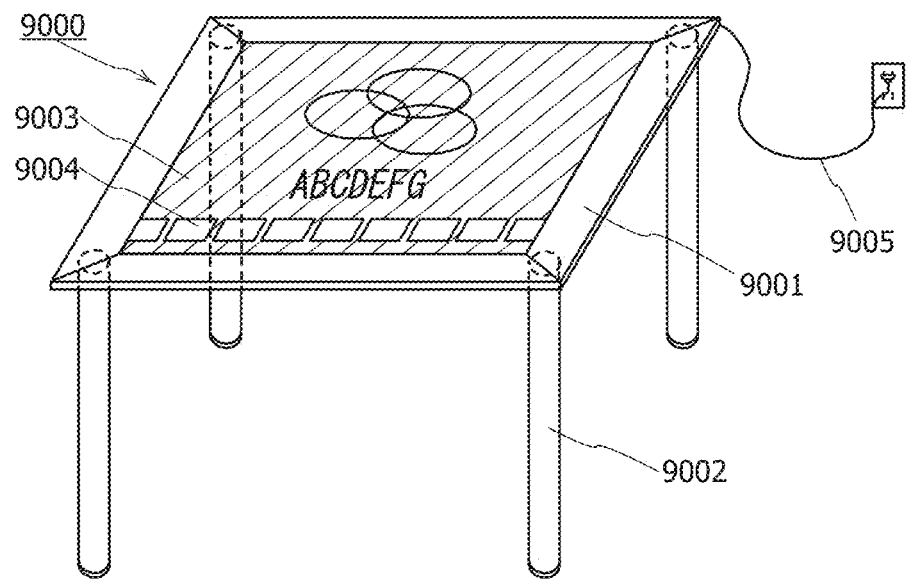
FIGS. 27A to 27C illustrate examples of electronic devices.
Figure 27B:
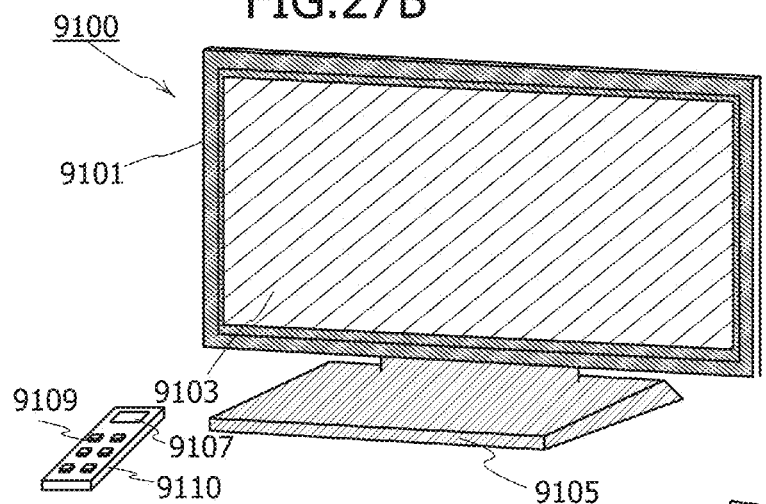
Figure 27C:
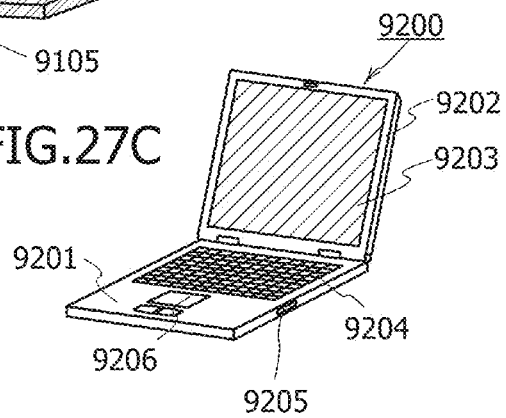

FIG. 27A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The display portion 9003 has a touch-input function. When a user touches displayed buttons 9004 which are displayed on the display portion 9003 of the table 9000 with his/her finger or the like, the user can carry out operation of the screen and input of information. Further, when the table 9000 may be made to communicate with home appliances or control the home appliances, the table 9000 may serve as a control device which controls the home appliances by operation on the screen. For example, with the use of a semiconductor device having an image sensor function, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 27B illustrates a television set 9100. In the television set 9100, a display portion 9103 is incorporated in a housing 9101 and an image can be displayed on the display portion 9103. Note that here, the housing 9101 is supported by a stand 9105.

The television set 9100 can operate with an operation switch of the housing 9101 or a separate remote controller 9110. Volume and receiving channels can be controlled with an operation key 9109 of the remote controller 9110 so that an image displayed on the display portion 9103 can be controlled. Further, the remote controller 9110 may be provided with a display portion 9107 for displaying data on the operation of the television set 9100, the time, a date, and the like.

The television set 9100 is provided with a receiver, a modem, and the like. With the use of the receiver, the television set 9100 can receive general TV broadcasts. Moreover, when the television set 9100 is connected to a communication network with or without wires via the modem, one-way (from a sender to a receiver) or two-way (between a sender and a receiver or between receivers) information communication can be performed.

FIG. 27C illustrates a computer 9200. The computer 9200 includes a main body 9201, a housing 9202, a display portion 9203, a keyboard 9204, an external connection port 9205, a pointing device 9206, and the like.

The semiconductor device described in any of the above embodiments can be used for the display portion 9203. Thus, the display quality of the computer 9200 can be improved.

FIGS. 28A and 28B illustrate a foldable tablet terminal 9600. The foldable tablet terminal 9600 includes a housing 9630, a display portion 96311a, a display portion 9631b, a display-mode switching button 9034, a power button 9035, a power-saving-mode switching button 9036, a clip 9033, an operation button 9038, and the like.

Further, the foldable tablet terminal 9600 includes a solar battery 9633 and a charge and discharge control circuit 9634. Note that FIG. 28B illustrates an example in which the charge and discharge control circuit 9634 includes a battery 9635 and a DCDC converter 9636.

The two display portions 9631a and 9631b are opened in FIG. 28A and closed in FIG. 28B.

Part of the display portion 96311a can be a touch panel region 9632a, and data can be input by touching operation keys 9638 that are displayed. Note that FIG. 28A shows, as an example, that half of the area of the display portion 9631a has only a display function, and the other half of the area has a touch panel function. However, the structure of the display portion 96311a is not limited to this, and all the area of the display portion 9631a may have a touch panel function. For example, all the area of the display portion 96311a can display keyboard buttons and function as a touch panel while the display portion 9631b can be used as a display screen.

In the display portion 9631b, as in the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The display-mode switching button 9034 allows switching between a portrait mode and a landscape mode, and between monochrome display and color display, for example. With the power-saving-mode switching button 9036, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

In FIG. 28A, the specification of the display portion 9631b may be different from that of the display portion 9631a. For example, the screen size or resolution may be different.

Since the tablet terminal can be foldable, the housing 9630 can be closed when the tablet terminal is not in use. Thus, the display portions 9631a and 9631b can be protected, whereby a tablet terminal with high endurance and high reliability for long-term use can be provided.

The tablet terminal illustrated in FIGS. 28A and 28B can also have a function of displaying various kinds of data (e.g., a still image, a moving image, and a text image) on the display portion, a function of displaying a calendar, a date, the time, or the like on the display portion, a touch-input function of inputting data by touching the display portion with a finger or the like, a function of executing various kinds of software (programs), and the like.

The solar battery 9633, which is attached to the surface of the tablet terminal, supplies electric power to a touch panel, a display portion, an image signal processor, and the like. Note that the solar battery 9633 can be provided on one or both surfaces of the housing 9630, so that the battery 9635 can be charged efficiently. When a lithium ion battery is used as the battery 9635, there is an advantage of downsizing or the like.

FIG. 28C is a block diagram of the charge and discharge control circuit 9634. The structure and operation are described with reference to the block diagram. As shown in FIG. 28C, the charge and discharge control circuit 9634 is a control circuit for supplying electric power generated by the solar battery 9633 to the display portion 9631. Here, the charge and discharge control circuit 9634 includes the battery 9635, the DCDC converter 9636, a converter 9637, and switches SW1 to SW3.

In the case where the electric power generated by the solar battery 9633 is charged to the battery 9635, the switch SW2 is turned on. The DCDC converter 9636 steps up or down an output voltage from the solar battery 9633 to a voltage appropriate for charge of the battery 9635. The switch SW1 is turned on when the electric power generated by the solar battery 9633 is supplied, and the switch SW3 is turned on when the electric power is supplied from the battery 9635 to the display portion 9631. The converter 9637 steps up or down an input voltage to a voltage necessary for driving the display portion 9631.

Note that the solar battery 9633 is illustrated as an example of a power generation means; however, there is no particular limitation on the power generation means, and a piezoelectric element, a thermoelectric conversion element (Peltier element), or the like may be provided. Alternatively, a non-contact power transmission module which is capable of charging by transmitting and receiving power by wireless (without contact) may be provided.

This embodiment can be combined as appropriate with the other embodiment in this specification.

This application is based on Japanese Patent Application serial No. 2013-078202 filed with the Japan Patent Office on Apr. 4, 2013, the entire contents of which are hereby incorporated by reference.

What is claimed is:

1. A pulse generation circuit comprising:
    a first unit circuit comprising a first circuit, a second circuit, and a third circuit, the first to third circuits being connected in cascade; and
    a second unit circuit comprising a fourth circuit an input of which is connected to the second circuit and an output of which is connected to M (M is an integer of 2 or more) wirings,
    wherein the second circuit comprises a first output terminal, a second output terminal, a third output terminal, and a fourth output terminal,
    wherein the second circuit is configured to output a first signal from the first output terminal to the first circuit,
    wherein the second circuit is configured to output a second signal from the second output terminal to the third circuit,
    wherein the second circuit is configured to output a third signal from the third and fourth output terminals to the fourth circuit in accordance with a fourth signal input from the first circuit,
    wherein the second circuit is configured to stop the output of the third signal in accordance with a fifth signal input from the third circuit, and
    wherein the fourth circuit is configured to generate M pulse signals from the third signal and output the M pulse signals to the M wirings, respectively.

2. The pulse generation circuit according to claim 1,
    wherein the second circuit is configured to output a sixth signal to the fourth circuit, and
    wherein the fourth circuit is configured to input a constant voltage to the M wirings in accordance with the sixth signal.

3. The pulse generation circuit according to claim 1, wherein the second unit circuit is configured to generate the M pulse signals having pulsed widths corresponding to pulse widths of M control signals.

4. A semiconductor device comprising:
    2kMN pixel circuits (k, M, and N are each an integer of 2 or more) which are arranged in an array of 2kM rows and N columns;
    N source lines to which the pixel circuits in the same columns are connected and to each of which a source signal is input;
    a first gate driver and a second gate driver which each generate a gate signal for selecting the pixel circuit to which the source signal is input; and
    2kM gate lines to which the pixel circuits in the same rows are connected and to each of which the gate signal is input,
    wherein the first gate driver and the second gate driver each comprise the pulse generation circuit according to claim 1.

5. A pulse generation circuit, which includes a single conductivity type transistor, comprising:
    k (k is an integer of 2 or more)-stage first unit circuits connected in cascade; and
    k second unit circuits in each of which an input is connected to one of the first unit circuits and an output is connected to M (M is an integer of 2 or more) first wirings,
    the first unit circuit comprising:
        a second wiring to which a first voltage is input;
        a third wiring to which a second voltage lower than the first voltage is input;
        a first node, a second node, a third node, and a fourth node;

a first output terminal, a second output terminal, a third output terminal, and a fourth output terminal outputting voltage changes in the first node, the second node, the third node, and the fourth node as a first signal, a second signal, a third signal, and a fourth signal, respectively;

a first input terminal and a second input terminal to which a first control signal and a second control signal are input, respectively;

a third input terminal to which a third signal generated in the first unit circuit in a previous stage is input;

a fourth input terminal to which a fourth signal generated in the first unit circuit in a next stage is input;

a first transistor which connects the first node and the second wiring and a gate of which is connected to the third input terminal;

a second transistor which connects the first node and the third wiring and a gate of which is connected to the second node;

a third transistor which connects the second node and the second wiring and a gate of which is connected to the fourth input terminal;

a fourth transistor which connects the second node and the third wiring and a gate of which is connected to the third input terminal;

a fifth transistor which connects the fourth node and the first input terminal and a gate of which is connected to the first node;

a sixth transistor which connects the fourth node and the third wiring and a gate of which is connected to the second node;

a seventh transistor which connects the third node and the second input terminal and a gate of which is connected to the first node; and an eighth transistor which connects the third node and the third wiring and a gate of which is connected to the second node, the second unit circuits each comprising M third unit circuits to which different M control signals are input, and the third unit circuit comprising:
the third wiring to which the second voltage is input;
a fifth input terminal to which the first signal is input from the first unit circuit;
a sixth input terminal to which the second signal is input from the first unit circuit;
a seventh input terminal to which any one of the M control signals is input;
a fifth output terminal to which any one of the M first wirings is connected;
a ninth transistor which connects the fifth output terminal and the fifth input terminal and a gate of which is connected to the fifth input terminal; and
a tenth transistor which connects the fifth output terminal and the third wiring and a gate of which is connected to the sixth input terminal.

6. The pulse generation circuit according to claim 5, wherein the first unit circuit includes an eleventh transistor in which the first voltage is input to a gate thereof and which connects the first node and the gate of the fifth transistor.

7. The pulse generation circuit according to claim 5, wherein the first unit circuit includes a twelfth transistor in which the first voltage is input to a gate thereof and which connects the first node and the gate of the seventh transistor.

8. The pulse generation circuit according to claim 5, the first unit circuit comprising:
a ninth input terminal to which a third control signal is input; and
a thirteenth transistor which connects the second node and the second wiring and a gate of which is connected to the ninth input terminal.

9. The pulse generation circuit according to claim 5, the first unit circuit comprising:
a tenth input terminal to which a fourth control signal is input; and
a fourteenth transistor which connects the second node and the second wiring and a gate of which is connected to the tenth input terminal.

10. The pulse generation circuit according to claim 5, wherein the third unit circuit includes a fifteenth transistor in which the first voltage is input to a gate thereof and connects the seventh input terminal and the gate of the ninth transistor.

11. A semiconductor device comprising:
2kMN pixel circuits (k, M, and N are each an integer of 2 or more) which are arranged in an array of 2kM rows and N columns;
N source lines to which the pixel circuits in the same columns are connected and to each of which a source signal is input;
a first gate driver and a second gate driver which each generate a gate signal for selecting the pixel circuit to which the source signal is input; and
2kM gate lines to which the pixel circuits in the same rows are connected and to each of which the gate signal is input,
wherein the first gate driver and the second gate driver each comprise the pulse generation circuit according to claim 5.

12. A semiconductor device comprising:
2kMN pixel circuits (k, M, and N are each an integer of 2 or more) which are arranged in an array of 2kM rows and N columns;
N source lines to which the pixel circuits in the same columns are connected and to each of which a source signal is input;
a first gate driver and a second gate driver which each generate a gate signal for selecting the pixel circuit to which the source signal is input; and
2kM gate lines to which the pixel circuits in the same rows are connected and to each of which the gate signal is input,
wherein the 2kM gate lines are alternately connected to the first gate driver and the second gate driver in every M rows,
the first gate driver and the second gate driver each comprising:
a single conductivity type transistor;
a shift register including k-stage first unit circuits connected in cascade; and
k second unit circuits in each of which an input is connected to one of the first unit circuits and an output is connected to M wirings,
wherein one of the first unit circuits comprises a first output terminal, a second output terminal, a third output terminal, and a fourth output terminal,
wherein the one of the first unit circuits is configured to output a first signal from the first output terminal to a previous stage of the one of the first unit circuits,
wherein the one of the first unit circuits is configured to output a second signal from the second output terminal to a next stage of the one of the first unit circuits,
wherein the one of the first unit circuits is configured to output a third signal from the third and fourth output terminals to one of the second unit circuits in accordance with a fourth signal input from the previous stage of the one of the first unit circuits, wherein each of the second unit circuits has a function of dividing an output signal from each of the first unit circuits into M signals in accordance with M control signals and outputting the M signals to the M wirings as the gate signals.

13. The semiconductor device according to claim 12, wherein each of the second unit circuits is configured to generate the M gate signals having pulsed widths corresponding to pulse widths of the M control signals.

* * * * *